(12) United States Patent
Moon et al.

(10) Patent No.: US 12,707,735 B2
(45) Date of Patent: Aug. 11, 2026

(54) IMAGE SENSOR

(71) Applicant: Samsung Electronics Co., Ltd., Suwon-si (KR)

(72) Inventors: Sanghyuck Moon, Suwon-si (KR); Jueun Park, Suwon-si (KR); Hyuncheol Kim, Suwon-si (KR); Jungbin Yun, Suwon-si (KR); Seungjoon Lee, Suwon-si (KR); Taesub Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 278 days.

(21) Appl. No.: 18/374,343

(22) Filed: Sep. 28, 2023

(65) Prior Publication Data

US 2024/0128287 A1 Apr. 18, 2024

(30) Foreign Application Priority Data

Oct. 12, 2022 (KR) ........................ 10-2022-0130815

(51) Int. Cl.
*H10F 39/00* (2025.01)
*H10F 39/18* (2025.01)

(52) U.S. Cl.
CPC ....... *H10F 39/8033* (2025.01); *H10F 39/014* (2025.01); *H10F 39/182* (2025.01)

(58) Field of Classification Search
CPC ... H10F 39/8033; H10F 39/014; H10F 39/182
See application file for complete search history.

(56) References Cited

U.S. PATENT DOCUMENTS

| | | | | |
|---|---|---|---|---|
| 9,337,224 | B2 | 5/2016 | Ihara | |
| 9,385,157 | B2 | 7/2016 | Jung et al. | |
| 10,043,838 | B2 | 8/2018 | Kwag et al. | |
| 10,916,572 | B2 | 2/2021 | Kim et al. | |
| 2011/0181749 | A1* | 7/2011 | Yamada ................ | H10F 39/199 257/E31.073 |
| 2018/0090537 | A1* | 3/2018 | Ma ...................... | H10F 39/8033 |
| 2021/0305296 | A1 | 9/2021 | Lee | |
| 2022/0077215 | A1* | 3/2022 | Horikoshi ............. | H10F 39/809 |
| 2022/0102398 | A1 | 3/2022 | Kim et al. | |
| 2023/0282674 | A1* | 9/2023 | Jeong ...................... | H10F 39/18 257/292 |

FOREIGN PATENT DOCUMENTS

| | | | |
|---|---|---|---|
| JP | 2012044004 | A | 3/2012 |
| KR | 10-2019-0102767 | A | 9/2019 |
| KR | 102087233 | B1 | 3/2020 |
| KR | 10-2022-0064787 | A | 5/2022 |

* cited by examiner

*Primary Examiner* — Matthew L Reames
(74) *Attorney, Agent, or Firm* — Muir Patent Law, PLLC

(57) ABSTRACT

An image sensor including a substrate, at least one transfer gate on a top surface of the substrate, a floating diffusion region located in the substrate and disposed apart from the at least one transfer gate in a first direction, the first direction being parallel to the top surface of the substrate, an intrinsic semiconductor region located in the substrate and disposed between the at least one transfer gate and the floating diffusion region in the first direction, and a photoelectric conversion region located in the substrate and disposed apart from the floating diffusion region in a second direction, wherein the second direction is perpendicular to the first direction, and wherein the intrinsic semiconductor region is an undoped region.

20 Claims, 32 Drawing Sheets

A1-A1'

A1-A1'

IMAGE SENSOR

CROSS-REFERENCE TO RELATED APPLICATION

This application is based on and claims priority under 35 U.S.C. § 119 to Korean Patent Application No. 10-2022-0130815, filed on Oct. 12, 2022, in the Korean Intellectual Property Office, the disclosure of which is incorporated by reference herein in its entirety.

BACKGROUND

Aspects of the inventive concept relate to an image sensor. More specifically, aspects of the inventive concept relates to an image sensor including a photoelectric conversion region.

An image sensor may be a device configured to convert an optical image into an electrical signal. Commonly used image sensors may include charge-coupled device (CCD)-type image sensors and complementary-metal-oxide-semiconductor (CMOS) image sensors (CISs). An image sensor may include a plurality of pixels arranged in a two-dimensional (2D) matrix form, and each of the pixels may output an image signal from light energy. Each of the pixels may accumulate photocharges corresponding to the quantity of light incident through a photoelectric conversion region and output a pixel signal based on the accumulated photocharges. In recent years, to increase the full-well capacity (FWC) of image sensors, a greater number of transfer gates are being included in image sensors.

SUMMARY

Aspects of the inventive concept provide an image sensor having improved noise characteristics.

According to an aspect of the inventive concept, there is provided an image sensor including a substrate, at least one transfer gate on a top surface of the substrate, a floating diffusion region located in the substrate and disposed apart from the at least one transfer gate in a first direction, the first direction being parallel to the top surface of the substrate, an intrinsic semiconductor region located in the substrate and disposed between the at least one transfer gate and the floating diffusion region in the first direction, and a photoelectric conversion region located in the substrate and disposed apart from the floating diffusion region in a second direction, the second direction being perpendicular to the first direction, wherein the intrinsic semiconductor region is an undoped region.

According to another aspect of the inventive concept, there is provided an image sensor including a substrate, a floating diffusion region in the substrate, a plurality of photoelectric conversion regions located in the substrate and disposed around the floating diffusion region, a plurality of transfer gates, at least one transfer gate being in each of the plurality of photoelectric conversion regions and disposed apart from the floating diffusion region in a first direction, the first direction being parallel to a top surface of the substrate, and an intrinsic semiconductor region located in the substrate and disposed between each of the transfer gates and the floating diffusion region in the first direction, wherein the intrinsic semiconductor region is an undoped region.

According to another aspect of the inventive concept, there is provided an image sensor including a substrate, two transfer gates on a top surface of the substrate, a floating diffusion region located in the substrate and disposed apart from the transfer gates in a first direction, the first direction being parallel to the top surface of the substrate, an intrinsic semiconductor region located in the substrate and disposed between each of the transfer gates and the floating diffusion region in the first direction, an impurity semiconductor region being in contact with the floating diffusion region and the intrinsic semiconductor region, the impurity semiconductor region being doped with conductive impurities, and a photoelectric conversion region located in the substrate and disposed apart from the floating diffusion region in a second direction, wherein the second direction is perpendicular to the first direction, wherein the intrinsic semiconductor region is an undoped region and extends in the second direction to a top surface of the photoelectric conversion region.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
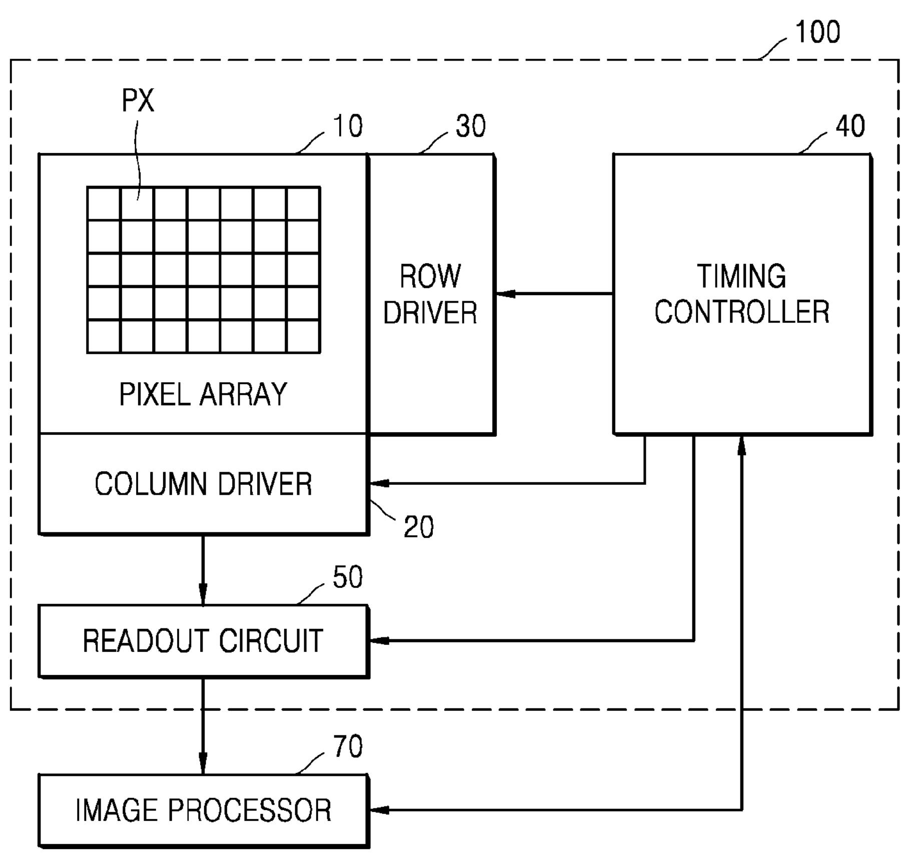
FIG. 1 is a block diagram of an image sensor according to an embodiment.

Hereinafter, embodiments of the inventive concept will be described in detail with reference to the accompanying drawings. Like reference numerals in the accompanying drawings refer to like elements throughout, and duplicate descriptions thereof are omitted.

FIG. 1 is a block diagram of an image sensor 100 according to an embodiment.

Referring to FIG. 1, the image sensor 100 according to embodiments may include a pixel array 10 and circuits configured to control the pixel array 10. In embodiments, the circuits configured to control the pixel array 10 may include a column driver 20, a row driver 30, a timing controller 40, and a readout circuit 50.

The image sensor 100 may operate in response to a control command received from an image processor 70. The image sensor 100 may convert light transmitted from an external object into an electric signal and output the electric signal to the image processor 70. The image sensor 100 may be a complementary metal-oxide-semiconductor (CMOS) image sensor.

The pixel array 10 may include a plurality of unit pixels PX having a two-dimensional (2D) array structure arranged in a matrix form along a plurality of row lines and a plurality of column lines.

Each of the plurality of unit pixels PX may include a photoelectric conversion region. The photoelectric conversion region may generate electric charges by receiving light transmitted from the object. The image sensor 100 may perform an autofocus function by using a phase difference between pixel signals generated from a plurality of photoelectric conversion elements included in the plurality of unit pixels PX. Each of the unit pixels PX may include a pixel circuit configured to generate a pixel signal from the electric charges generated by the photoelectric conversion region.

The column driver 20 may include a correlated double sampler (CDS), an analog-to-digital converter (ADC), and/or the like. The CDS may be connected, through column lines, to a unit pixel PX included in a row selected by a row selection signal supplied by the row driver 30 and perform correlated double sampling to detect a reset voltage and a pixel voltage. The ADC may convert the reset voltage and the pixel voltage each detected by the CDS into digital signals and transmit the digital signals to the readout circuit 50.

The readout circuit 50 may include a latch or buffer circuit capable of temporarily storing the digital signal, and/or an amplification circuit. The read circuit 50 may generate image data by temporarily storing or amplifying the digital signal received from the column driver 20. The operation timing of the column driver 20, the row driver 30, and the readout circuit 50 may be determined by the timing controller 40, and the timing controller 40 may operate based on a control command transmitted from the image processor 70.

The image processor 70 may signal-process image data output from the readout circuit 50 and output the signal-processed image data to a display device or store the signal-processed image data in a storage device, such as a memory. When the image sensor 100 is mounted on an autonomous vehicle, the image processor 70 may signal-process image data and transmit the signal-processed image data to a main controller that controls the autonomous vehicle.

Figure 2:
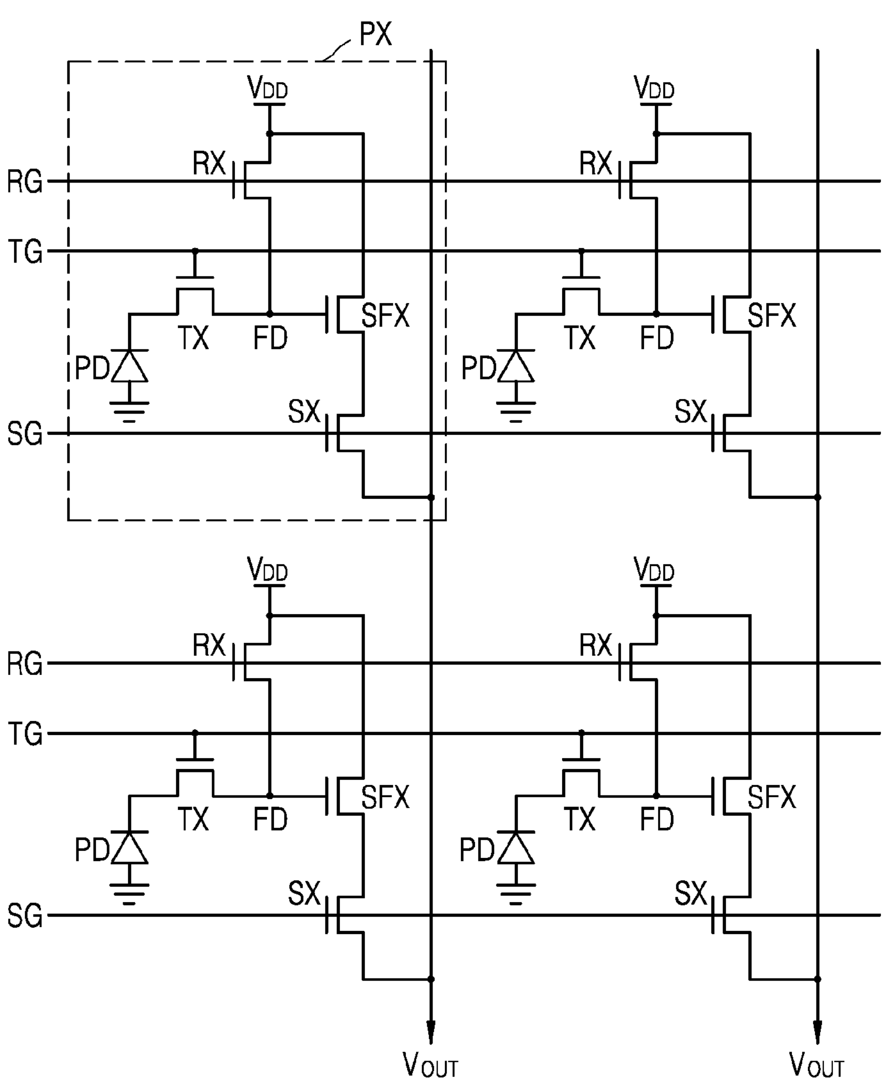
FIG. 2 is a circuit diagram of a pixel array of an image sensor, according to an embodiment.

FIG. 2 is a circuit diagram of a pixel array of an image sensor 100 according to an embodiment.

Referring to FIG. 2, unit pixels PX, each of which includes a transfer transistor TX and logic transistors (e.g., RX, SX, and SFX), may be arranged in an array form.

A plurality of unit pixels PX may be provided. In embodiments, the plurality of unit pixels PX may be arranged in a matrix form. Here, the logic transistors may include a reset transistor RX, a selection transistor SX, and a source follower transistor SFX. The reset transistor RX may include a reset gate RG, and the selection transistor SX may include a selection gate SG.

The unit pixel PX may include a photoelectric conversion region PD and a floating diffusion region FD. The photoelectric conversion region PD may generate and accumulate photocharges in proportion to the quantity of light incident from the outside and include a photodiode, a phototransistor, a photogate, a pinned photodiode (PPD), or a combination thereof.

The transfer transistor TX may transmit the photocharges generated in the photoelectric conversion region PD to the floating diffusion region FD. The floating diffusion region FD may receive the photocharges generated in the photoelectric conversion region PD and cumulatively store the photocharges. The source follower transistor SFX may be controlled according to the quantity of photocharges accumulated in the floating diffusion region FD. The transfer transistor TX may include a transfer gate TG.

The reset transistor RX may periodically reset the photocharges accumulated in the floating diffusion region FD. A drain electrode of the reset transistor RX may be connected to the floating diffusion region FD, and a source electrode of the reset transistor RX may be connected to a power supply voltage $V_{DD}$.

When the reset transistor RX is turned on, the power supply voltage $V_{DD}$ connected to the source electrode of the reset transistor RX may be transmitted to the floating diffusion region FD. When the reset transistor RX is turned on, photocharges accumulated in the floating diffusion region FD may be emitted, and thus, the floating diffusion region FD may be reset.

The source follower transistor SFX may be connected to a current source (not shown) located outside the unit pixel PX and function as a source follower buffer amplifier. The source follower transistor SFX may amplify a potential variation of the floating diffusion region FD and output the amplified potential variation to an output line $V_{OUT}$.

The selection transistor SX may select the plurality of unit pixels PX in units of rows. When the selection transistor SX is turned on, the power supply voltage VDD may be transmitted to a source electrode of the source follower transistor SFX.

Figure 3:
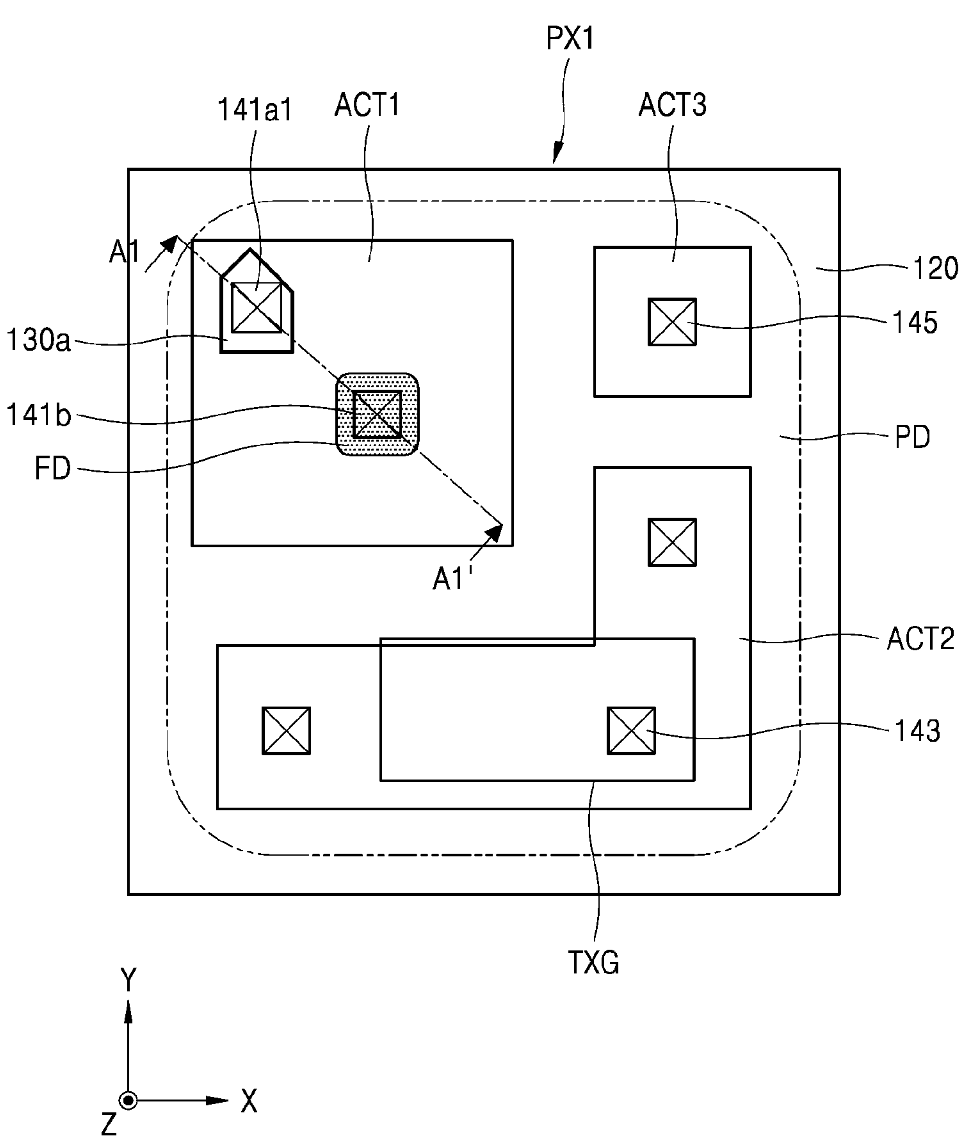
FIG. 3 is a plan view of a pixel of an image sensor, according to an embodiment.
Figure 4A:
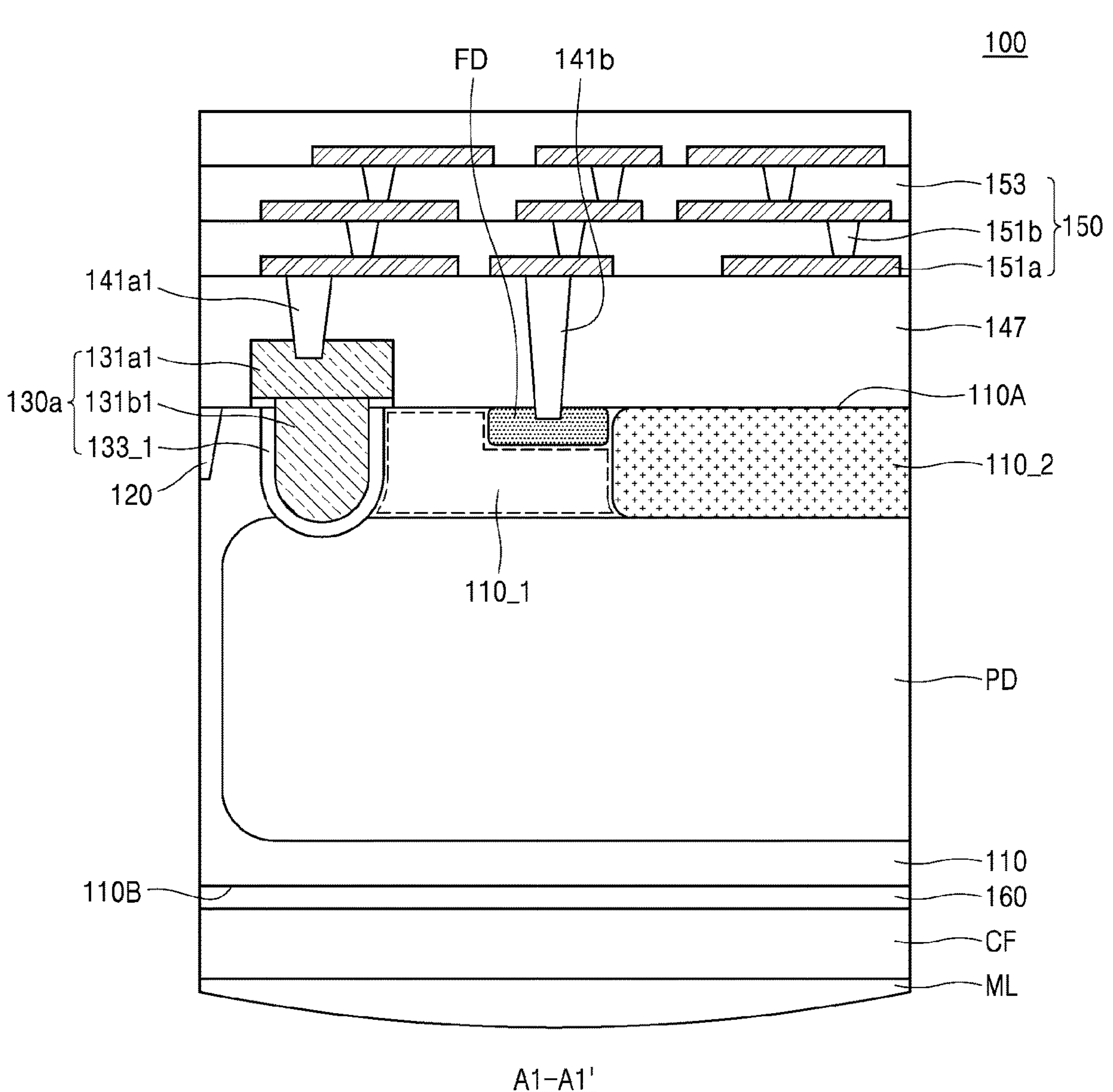
FIGS. 4A to 4D are cross-sectional views taken along line A1-A1' of FIG. 3.

FIG. 3 is a plan view of a pixel of an image sensor 100, according to an embodiment. FIG. 4A is a cross-sectional view taken along line A1-A1' of FIG. 3.

Referring to FIGS. 3 and 4A, the image sensor 100 may include a substrate 101 having a pixel area PX1. Although one pixel area PX1 is illustrated in FIG. 3, the substrate 110 may include a plurality of pixel areas PX1. In the substrate 110, the pixel area PX may be defined by a pixel isolation film (not shown). The pixel area PX1 may include a photoelectric conversion region PD formed in the substrate 110. In an embodiment, the photoelectric conversion region PD may be a region doped with first impurities. In an embodiment, the first impurities may be n-type impurities. The n-type impurities may be, for example, phosphorus (P) or arsenic (As). The pixel area PX1 may be a region configured to sense light incident from the outside.

The substrate 110 may include a front surface 110A and a rear surface 110B facing the front surface 110A. Here, the front surface 110A of the substrate 110 may also be referred to as a top surface of the substrate 110, and the rear surface 110B of the substrate 110 may also be referred to as a bottom surface of the substrate 110. Hereinafter, a direction parallel to the front surface 110A of the substrate 110 will be defined as a first direction, and a direction perpendicular to the first direction will be defined as a second direction.

In embodiments, the substrate 110 may include a semiconductor doped with P-type impurities. For example, the substrate 110 may include a semiconductor layer or a silicon on insulator (SOI) substrate. The semiconductor layer may include silicon (Si), germanium (Ge), silicon germanium (SiGe), a Group II-VI compound semiconductor, a Group III-V compound semiconductor, or a combination thereof. In embodiments, the substrate 110 may include a P-type epitaxial semiconductor layer, which is epitaxially grown from a P-type bulk silicon substrate.

The pixel isolation film may have a planar structure surrounding the photoelectric conversion region PD. The pixel isolation film may include, for example, silicon oxide, silicon nitride, silicon carbonitride (SiCN), silicon oxynitride (SiON), silicon oxycarbide (SiOC), polysilicon, a metal, a metal nitride, a metal oxide, borosilica glass (BSG), phosphosilica glass (PSG), borophosphosilica glass (BPSG), plasma-enhanced tetra ethyl ortho silicate (PE-TEOS), fluoride silicate glass (FSG), carbon doped silicon oxide (CDO), organo silicate glass (OSG), air, or a combination thereof. For example, the metal that may be included in the pixel isolation film may be tungsten (W), copper (Cu), or a combination thereof. The metal nitride that may be included in the pixel isolation film may be TiN, TaN, or a combination thereof. The metal oxide that may be included in the pixel isolation film may include indium tin oxide (ITO), aluminum oxide ($Al_2O_3$), or a combination thereof.

A device isolation film 120 defining a plurality of active areas (e.g., ACT1, ACT2, and ACT3 may be on the front surface 110A of the substrate 110. The plurality of active areas (e.g., ACT1, ACT2, and ACT3) may include a first active area ACT1, a second active area ACT2, and a third active area ACT3. A bottom surface of the device isolation film 120 may be disposed vertically apart from the photoelectric conversion region PD. In embodiments, the device isolation film 120 may include an insulating film, which includes a silicon oxide film, a silicon nitride film, a combination thereof.

A transfer transistor (refer to TX in FIG. 2) and a floating diffusion region FD may be in the first active area ACT1. The transfer transistor TX may include a transfer gate 130*a*.

In an embodiment, the transfer gate 130*a* may be a vertical transfer gate (VTG). Specifically, the transfer gate 130*a* may include a lateral portion 131*a*1, a vertical portion 131*b*1, and a gate insulating layer 133_1. The lateral portion 131*a*1 may be on the front surface 110A of the substrate 110. The vertical portion 131*b*1 may be connected to the lateral portion 131*a*1 and extend from a bottom surface of the lateral portion 131*a*1 into the substrate 110. The gate insulating layer 133_1 may cover a portion of the bottom surface of the lateral portion 131*a*1 and a sidewall of the vertical portion 131*b*1.

The lateral portion 131*a*1 may extend in the first direction on the front surface 110A of the substrate 110. The vertical portion 131*b*1 may be in contact with a portion of the bottom surface of the lateral portion 131*a*1 and extend from the front surface of the substrate 110 into the substrate 110 in the second direction. In this case, the vertical portion 131*b*1 may pass through a portion of the photoelectric conversion region PD formed in the substrate 110. The gate insulating layer 133_1 may cover a sidewall of the vertical portion 131*b*1 and a portion of the bottom surface of the lateral portion 131*a*, which is not in contact with a top surface of the vertical portion 131*b*1. In an embodiment, a portion of the gate insulating layer 133_1, which is adjacent to the floating diffusion region FD, may be in contact with an intrinsic semiconductor region 110_1. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" or "contact" another element, there are no intervening elements present at the point of contact.

The floating diffusion region FD may be on one side of the transfer gate 130*a* and disposed apart from the transfer gate 130*a* in the first direction. In an embodiment, the floating diffusion region FD may function as a drain of the transfer gate 130*a*. In an embodiment, the floating diffusion region FD may be a region doped with second impurities. In an embodiment, the second impurities may be n-type impurities. The n-type impurities may be, for example, phosphorus (P) or arsenic (As).

The intrinsic semiconductor region 110_1 may be between the floating diffusion region FD and the transfer gate 130*a*. Here, the intrinsic semiconductor region 110_1 may refer to a region that is not additionally doped with p-type impurities or n-type impurities. In an embodiment, the intrinsic semiconductor region 110_1 may not include p-type impurities or n-type impurities. In other embodiments, the intrinsic semiconductor region 110_1 may include impurities at a lower concentration than the floating diffusion region FD and the impurity semiconductor region 110_2. In an embodiment, the intrinsic semiconductor region 110_1 may extend in the second direction to a top surface of the photoelectric conversion region PD. Accordingly, a bottom surface of the intrinsic semiconductor region 110_1 may be in contact with the top surface of the photoelectric conversion region PD. In an embodiment, a partial region of the intrinsic semiconductor region 110_1, which is at a lower vertical level (i.e., in the second direction) than the floating diffusion region FD, may extend far away from the transfer gate 130*a* in the first direction. In this case, the partial region of the intrinsic semiconductor region 110_1, which extends in the first direction, may be under the floating diffusion region FD and entirely overlap the floating diffusion region FD in the second direction (i.e., in a vertical direction).

The impurity semiconductor region 110_2 may be on one side of the floating diffusion region FD, which is not adjacent to the transfer gate 130*a*. A partial region of the impurity semiconductor region 110_2, which is at a lower vertical level than the floating diffusion region FD, may be in contact with the partial region of the intrinsic semiconductor region 110_1, which extends in the first direction, and a remaining region of the impurity semiconductor region 110_2 except for the partial region of the impurity semiconductor region 110_2 may be in contact with the floating diffusion region FD. In an embodiment, the impurity semiconductor region 110_2 may be a region doped with third impurities. In an embodiment, the third impurities may be p-type impurities. The p-type impurities may be, for example, boron (B) or indium (In).

A first contact plug 141*a*1 may be in contact with the transfer gate 130*a*, and a second contact plug 141*b* may be in contact with the floating diffusion region FD. In an embodiment, the first contact plug 141*a*1 may pass through a portion of the lateral portion of the transfer gate 130*a*, and the second contact plug 141*b* may pass through a portion of the floating diffusion region FD. In an embodiment, the first contact plug 141*a*1 may include a first barrier conductive layer (not shown) and a first contact conductive layer (not shown), and the second contact plug 141*b* may include a second barrier conductive layer (not shown) and a second contact conductive layer (not shown). In an embodiment, the first barrier conductive layer and the second barrier conductive layer may include at least one of titanium (Ti), titanium nitride (TiN), tantalum (Ta), tantalum nitride (TaN), ruthenium (Ru), tungsten nitride (WN), and niobium nitride (NbN). In an embodiment, the first contact conductive layer and the second contact conductive layer may include at least one of tungsten (W), cobalt (Co), copper (Cu), aluminum (Al), and tungsten nitride (WN).

Logic transistors may be in the second active area ACT2. For example, at least one of a reset transistor RX, a source follower transistor SFX, and a selection transistor SX may be in the second active area ACT2. In another example, all of the reset transistor RX, the source follower transistor SFX, and the selection transistor SX may be in the second active area ACT2. In some embodiments, the source follower transistor SFX and the selection transistor SX may be in the second active area ACT2 of any one pixel area PX1, and the reset transistor RX may be in the second active area ACT2 of another pixel area PX1 adjacent thereto. In the above-described structure, the logic transistors may be shared between two adjacent ones of the pixel areas PX1. A pixel gate TXG may be in the second active area ACT2. The pixel gate TXG may be, for example, a reset gate (refer to RG in FIG. 2) or a selection gate (refer to SG in FIG. 2). Contact plugs 143 may be in the second active area ACT2. The contact plugs 143 may be power supply voltage contact plugs.

The third active area ACT3 may include an impurity region (not shown), and a contact plug 145 may be connected to the impurity region of the third active area ACT3. The impurity region of the third active area ACT3 may be a ground region, and the contact plug 145 connected to the impurity region may be a ground contact plug.

An interlayer insulating film 147 may be on the front surface 110A of the substrate 110. The interlayer insulating film 147 may cover the first to third active areas ACT1, ACT2, and ACT3 and the device isolation film 120.

In an embodiment, the interlayer insulating film 147 may include silicon nitride and/or silicon oxynitride. In an embodiment, an etch stop layer (not shown) may be between the interlayer insulating film 147 and the front surface 110A of the substrate 110.

A wiring structure 150 may be on the interlayer insulating film 147. The wiring structure 150 may include a plurality of wiring lines 151*a*, a plurality of wiring vias 151*b*, and a wiring insulating layer 153. The wiring insulating layer 153 may cover the plurality of wiring lines 151*a* and the plurality of wiring vias 151*b*. The wiring insulating layer 153 may include a single layer or a plurality of layers. In an embodiment, the wiring insulating layer 153 may include an insulating material, such as silicon oxide, silicon nitride, and silicon oxynitride. The plurality of wiring lines 151*a* may be on a top surface or a bottom surface of the wiring insulating layer 153 and extend along the top surface or the bottom surface of the wiring insulating layer 153. A lowermost one of the wiring lines 151*a* may be connected to the first and second contact plugs 141*a*1 and 141*b* and the contact plugs 143 and 145. The plurality of wiring vias 151*b* may connect the plurality of wiring lines 151*a* located at different vertical levels. In an embodiment, the plurality of wiring lines 151*a* and the plurality of wiring vias 151*b* may include tungsten, aluminum, copper, tungsten silicide, titanium silicide, tungsten nitride, titanium nitride, and/or doped polysilicon.

An anti-reflection film 160, a color filter CF, and a microlens ML may be sequentially stacked on the rear surface 110B of the substrate 110.

The anti-reflection film 160 may prevent incident light passing through the color filter CF from being laterally reflected or scattered. The anti-reflection film 160 may include a metal. For example, the anti-reflection film 160 may include tungsten, aluminum, copper, or a combination thereof. Differently from that shown in FIG. 4A, the anti-reflection film 160 may include a plurality of layers. For example, the anti-reflection film 160 may include a first anti-reflection layer (not shown), a second anti-reflection layer (not shown), and a third anti-reflection layer (not shown). The first anti-reflection layer, the second anti-reflection layer, and the third anti-reflection layer may include the same metal as each other. For example, each of the first anti-reflection layer, the second anti-reflection layer, and the third anti-reflection layer may include tungsten (W). However, the inventive concept is not limited thereto, and the first anti-reflection layer, the second anti-reflection layer, and the third anti-reflection layer may include different metals from each other.

The color filter CF may filter condensed light and provide the filtered light to the pixel area PX1. In embodiments, the color filter CF may include a red color filter, a green color filter, a blue color filter, or a white color filter. The white color filter may be a transparent color filter that transmits light in a visible wavelength band. In other embodiments, the color filter CF may have another color, such as cyan, magenta, or yellow.

The microlens ML may condense incident light. The microlens ML may be arranged to correspond to the photoelectric conversion region PD. The microlens ML may have an outwardly convex shape to condense light incident on the photoelectric conversion region PD. The microlens ML may be transparent. For example, the microlens ML may have a transmittance of about 90% or higher with respect to light in a visible light range. The microlens ML may include a material, for example, a styrene-based resin, an acrylic resin, a styrene-acryl copolymer resin, or a siloxane-based resin.

The image sensor 100 according to the embodiments may include the intrinsic semiconductor region 110_1, which is between the transfer gate 130*a* and the floating diffusion region FD and not additionally doped with impurities. Accordingly, when impurities are doped between the transfer gate 130*a* and the floating diffusion region FD, random dopant fluctuation (RDF), which may occur due to the doped impurities, may be reduced. As a result, noise characteristics of the image sensor 100 may be improved, and the full-well capacity (FWC) of the image sensor 100 may be improved by preventing the occurrence of a potential hump.

Figure 4B:
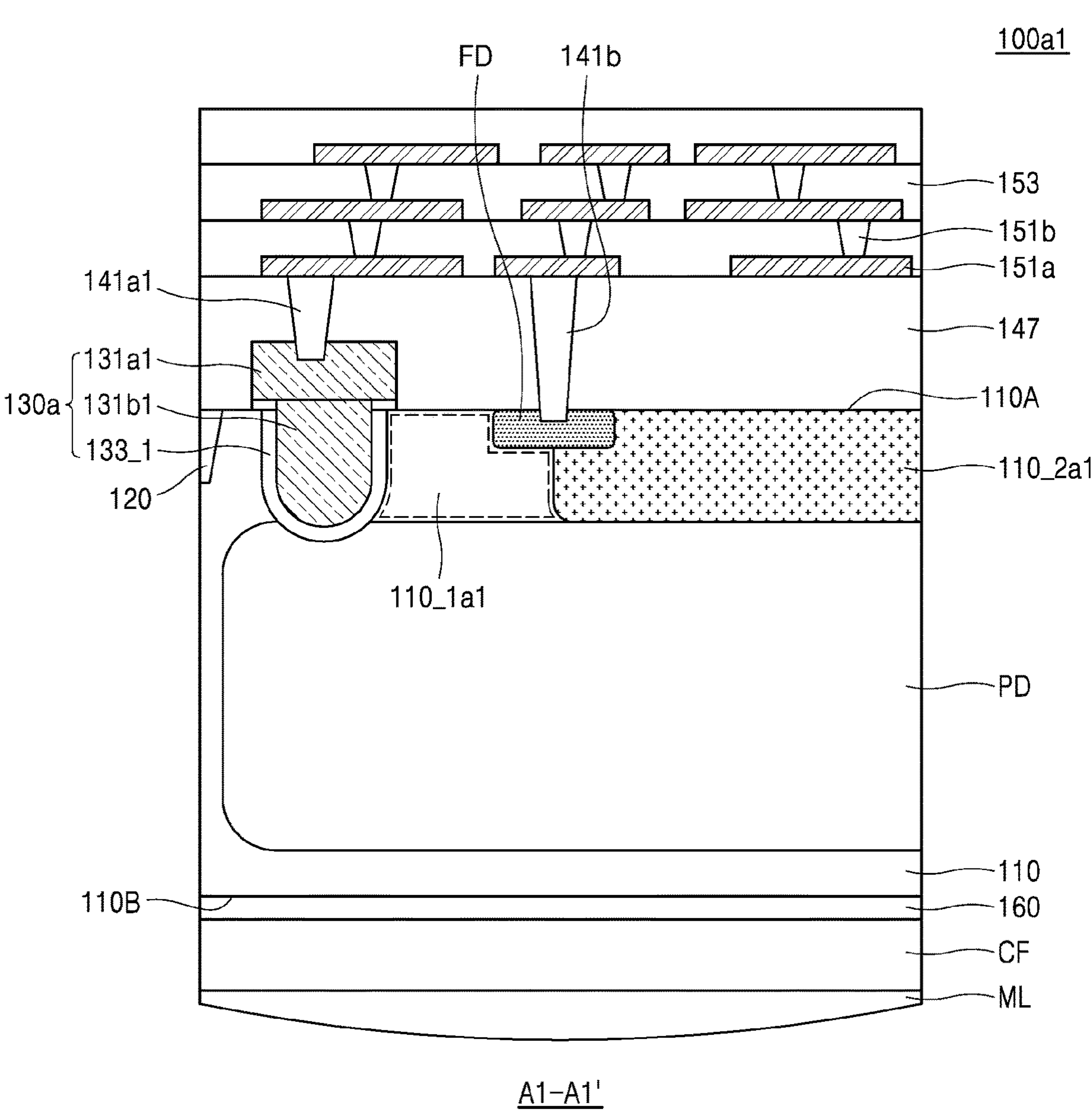
Figure 4C:
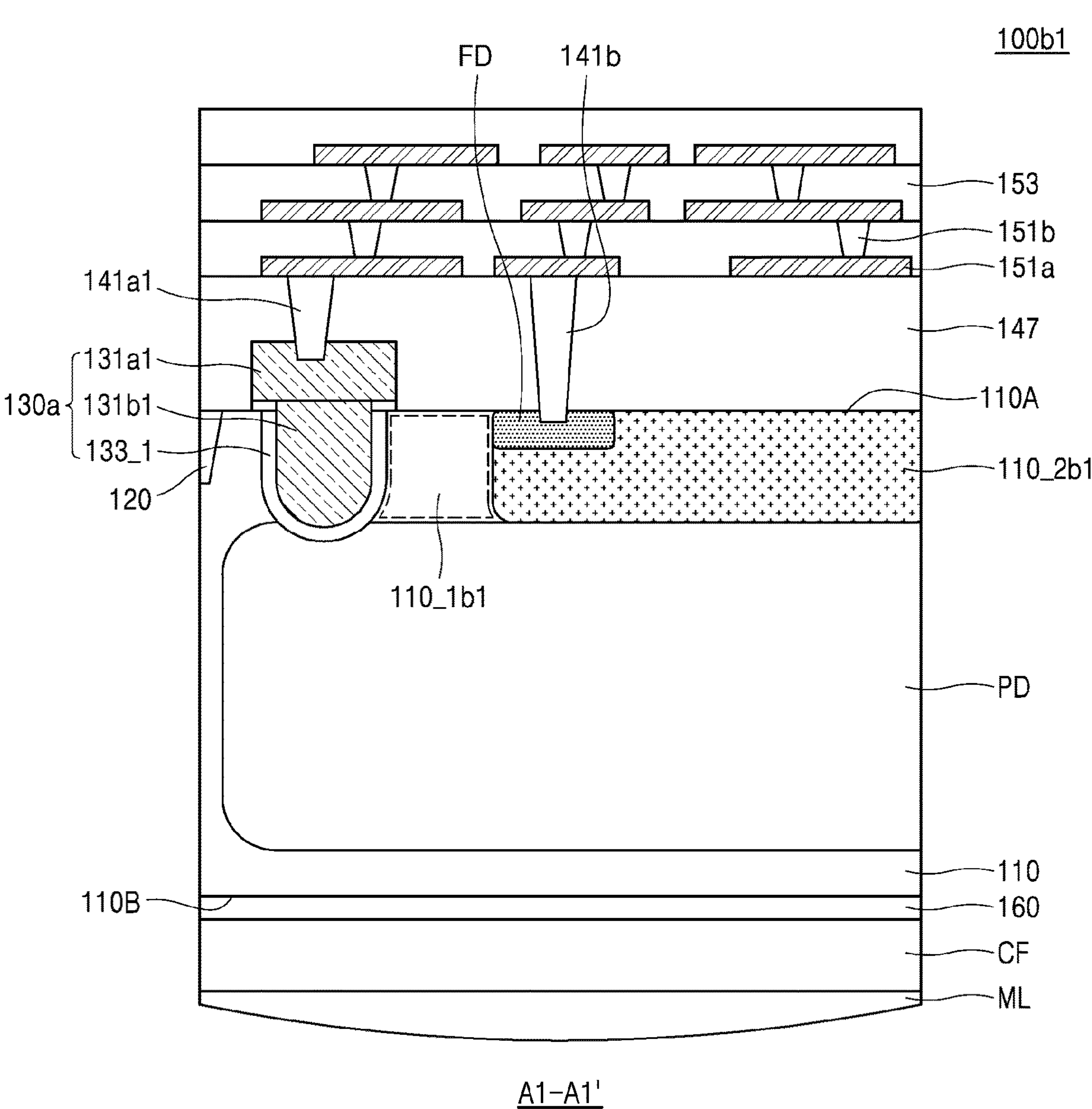
Figure 4D:
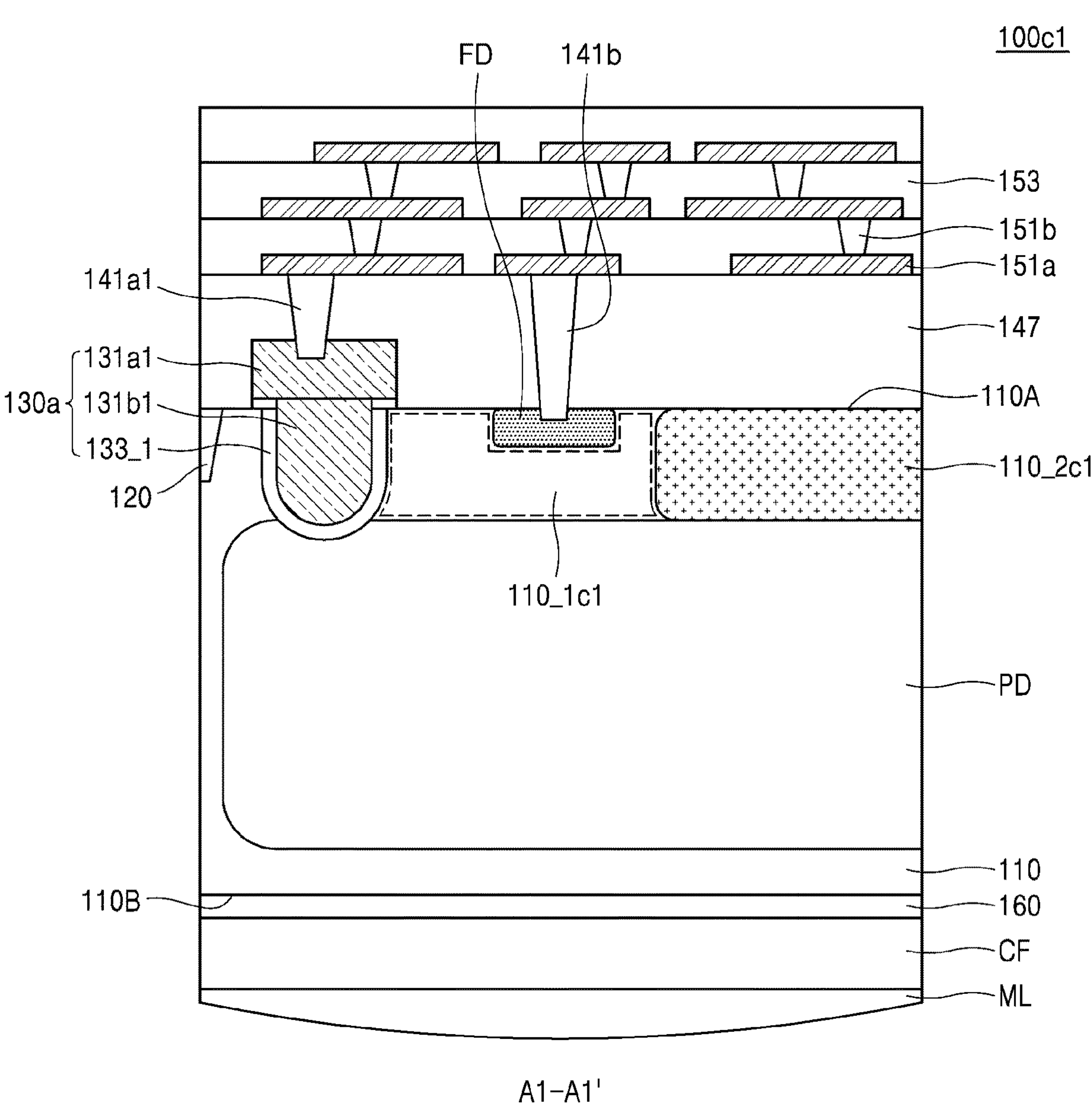

FIGS. 4B to 4D are cross-sectional views corresponding to a cross-section taken along line A1-A1' of FIG. 3. Respective components of image sensors 100*a*1, 100*b*1, and 100*c*1 shown in FIGS. 4B to 4D are similar to respective components of the image sensor 100 described with reference to FIGS. 3 and 4A, and thus, differences therebetween will be mainly described.

Referring to FIG. 4B, the image sensor 100*a*1 may include an intrinsic semiconductor region 110_1*a*1 and an impurity semiconductor region 110_2*a*1. The intrinsic semiconductor region 110_1*a*1 may be between a floating diffusion region FD and a transfer gate 130*a*. In an embodiment, a partial region of the intrinsic semiconductor region 110_1*a*1, which is at a lower vertical level than the floating diffusion region FD, may extend away from the transfer gate

130*a* in the first direction. In this case, the partial region of the intrinsic semiconductor region 110_1*a*1, which extends in the first direction, may be under the floating diffusion region FD and may overlap a portion of the floating diffusion region FD in the second direction (i.e., the vertical direction).

The impurity semiconductor region 110_2*a*1 may be on one side of the floating diffusion region FD, which is not adjacent to the transfer gate 130*a*. In this case, a partial region of the impurity semiconductor region 110_2*a*1, which is at a lower vertical level than the floating diffusion region FD, may extend toward the transfer gate 130*a* in the first direction. In this case, the partial region of the impurity semiconductor region 110_2*a*1, which extends in the first direction, may overlap a remaining partial region of the floating diffusion region FD in the second direction (i.e., the vertical direction). Here, the remaining partial region of the floating diffusion region FD may refer to a remaining region except for the partial region of the floating diffusion region FD, which overlaps, in the second direction, the partial region of the intrinsic semiconductor region 110_1*a*1, which extends in the first direction. In addition, the partial region of the impurity semiconductor region 110_2*a*1, which extends in the first direction, may be in contact with the partial region of the intrinsic semiconductor region 110_1*a*1, which extends in the first direction.

Referring to FIG. 4C, the image sensor 100*b*1 may include an intrinsic semiconductor region 110_1*b*1 and an impurity semiconductor region 110_2*b*1. The intrinsic semiconductor region 110_1*b*1 may be between a floating diffusion region FD and a transfer gate 130*a*. In an embodiment, the intrinsic semiconductor region 110_1*b*1 may not overlap the floating diffusion region FD in the second direction. For example, a partial region of the intrinsic semiconductor region 110_1*b*1, which is at a lower vertical level than the floating diffusion region FD, may not extend in the first direction.

The impurity semiconductor region 110_2*b*1 may be on one side of the floating diffusion region FD, which is not adjacent to the transfer gate 130*a*. In this case, a partial region of the impurity semiconductor region 110_2*b*1, which is at a lower vertical level than the floating diffusion region FD, may extend toward the transfer gate 130*a* in the first direction. In this case, the partial region of the impurity semiconductor region 110_2*b*1, which extends in the first direction, may overlap the entire floating diffusion region FD in the second direction. Also, the partial region of the impurity semiconductor region 110_2*b*1, which extends in the first direction, may be in contact with the partial region of the intrinsic semiconductor region 110_1*b*1, which is at a lower vertical level than the floating diffusion region FD.

Referring to FIG. 4D, the image sensor 100*c*1 may include an intrinsic semiconductor region 110_1*c*1 and an impurity semiconductor region 110_2*c*1.

The intrinsic semiconductor region 110_1*c*1 may be between a floating diffusion region FD and the transfer gate 130*a*. In an embodiment, the intrinsic semiconductor region 110_1*c*1 may surround the floating diffusion region FD. Specifically, the intrinsic semiconductor region 110_1*c*1 may surround a bottom surface and a sidewall of the floating diffusion region FD.

The impurity semiconductor region 110_2*c*1 may be on one side of the floating diffusion region FD, which is not adjacent to the transfer gate 130*a*. In this case, the impurity semiconductor region 110_2*c*1 may be disposed apart from the floating diffusion region FD. The impurity semiconductor region 110_2*c*1 may be in contact with the intrinsic semiconductor region 110_1*c*1.

Figure 5:
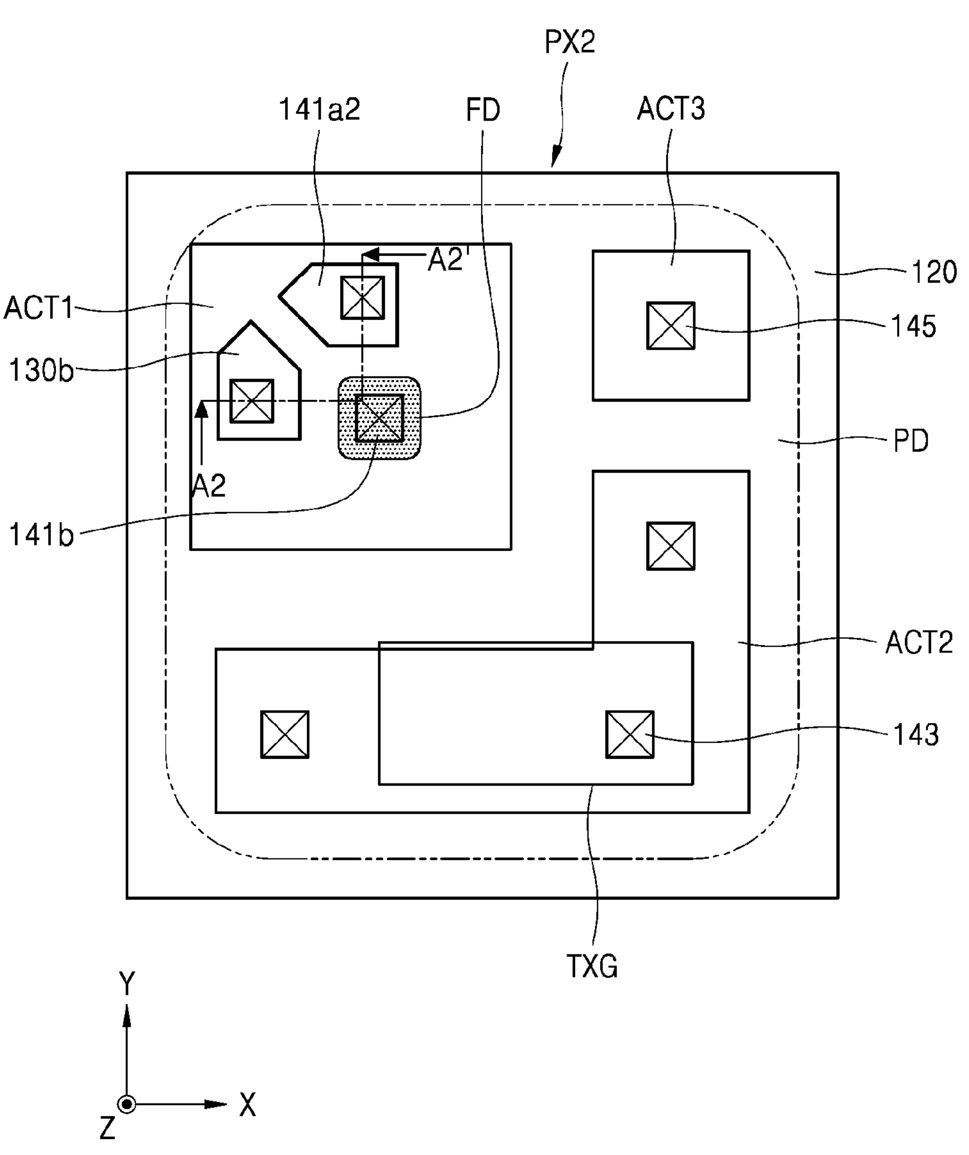
FIG. 5 is a plan view of a pixel of an image sensor, according to an embodiment.
Figure 6A:
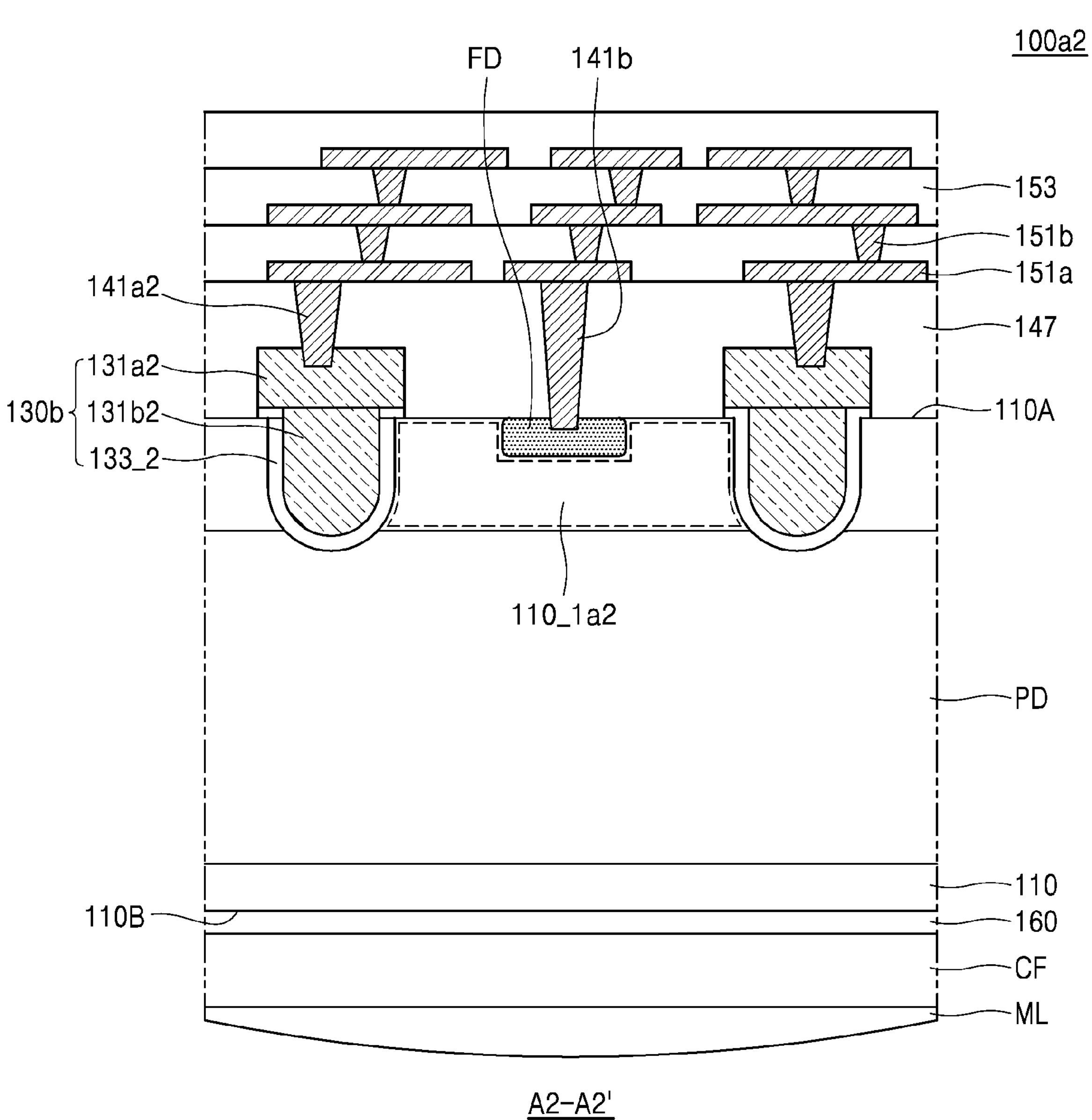
FIGS. 6A to 6C are cross-sectional views taken along line A2-A2' of FIG. 5.

FIG. 5 is a plan view of a pixel of an image sensor 100*a*2, according to an embodiment. FIG. 6A is a cross-sectional view taken along line A2-A2' of FIG. 5. Respective components of the image sensor 100*a*2 shown in FIGS. 5 and 6A are similar to respective components of the image sensor 100 described with reference to FIGS. 3 and 4A, and thus, differences therebetween will be mainly described.

Referring to FIGS. 5 and 6A, the image sensor 100*a*2 may include a unit pixel PX2, and a transfer transistor (refer to TX in FIG. 2) and a floating diffusion region FD may be in a first active area ACT1 located in the unit pixel PX2. The transfer transistor TX may include two transfer gates 130*b*. The two transfer gates 130*b* may be disposed apart from the floating diffusion region FD by the same distance as each other. Specifically, on an X-Y plane, any one of the two transfer gates 130*b* may be disposed apart from the floating diffusion region FD in an X direction, while the other of the two transfer gates 130*b* may be apart from the floating diffusion region FD in a Y direction. In this case, a distance from any one of the two transfer gates 130*b* to the floating diffusion region FD in the X direction may be equal to a distance from the other of the two transfer gates 130*b* to the floating diffusion region FD in the Y direction.

In an embodiment, each of the two transfer gates 130*b* may include a VTG. Specifically, each of the two transfer gates 130*b* may include a lateral portion 131*a*2, a vertical portion 131*b*2, and a gate insulating layer 133_2. The lateral portion 131*a*2, the vertical portion 131*b*2, and the gate insulating layer 133_2 may be respectively similar to the lateral portion 131*a*1, the vertical portion 131*b*1, and the gate insulating layer 133_1, which have been described with reference to FIGS. 3 and 4A. In embodiments, the gate insulating layers 133_2 included in each of the two transfer gates 130*b* may be in contact with an intrinsic semiconductor region 110_1*a*2.

The two transfer gates 130*b* may be respectively connected to first contact plugs 141*a*2. The first contact plugs 141*a*2 may respectively pass through portions of the lateral portions 132*a*2 of the two transfer gates 130*b*.

The intrinsic semiconductor region 110_1*a*2 may be between each of the two transfer gates 130*b* and the floating diffusion region FD. The floating diffusion region FD may be surrounded by the intrinsic semiconductor region 110_1*a*2.

Figure 6B:
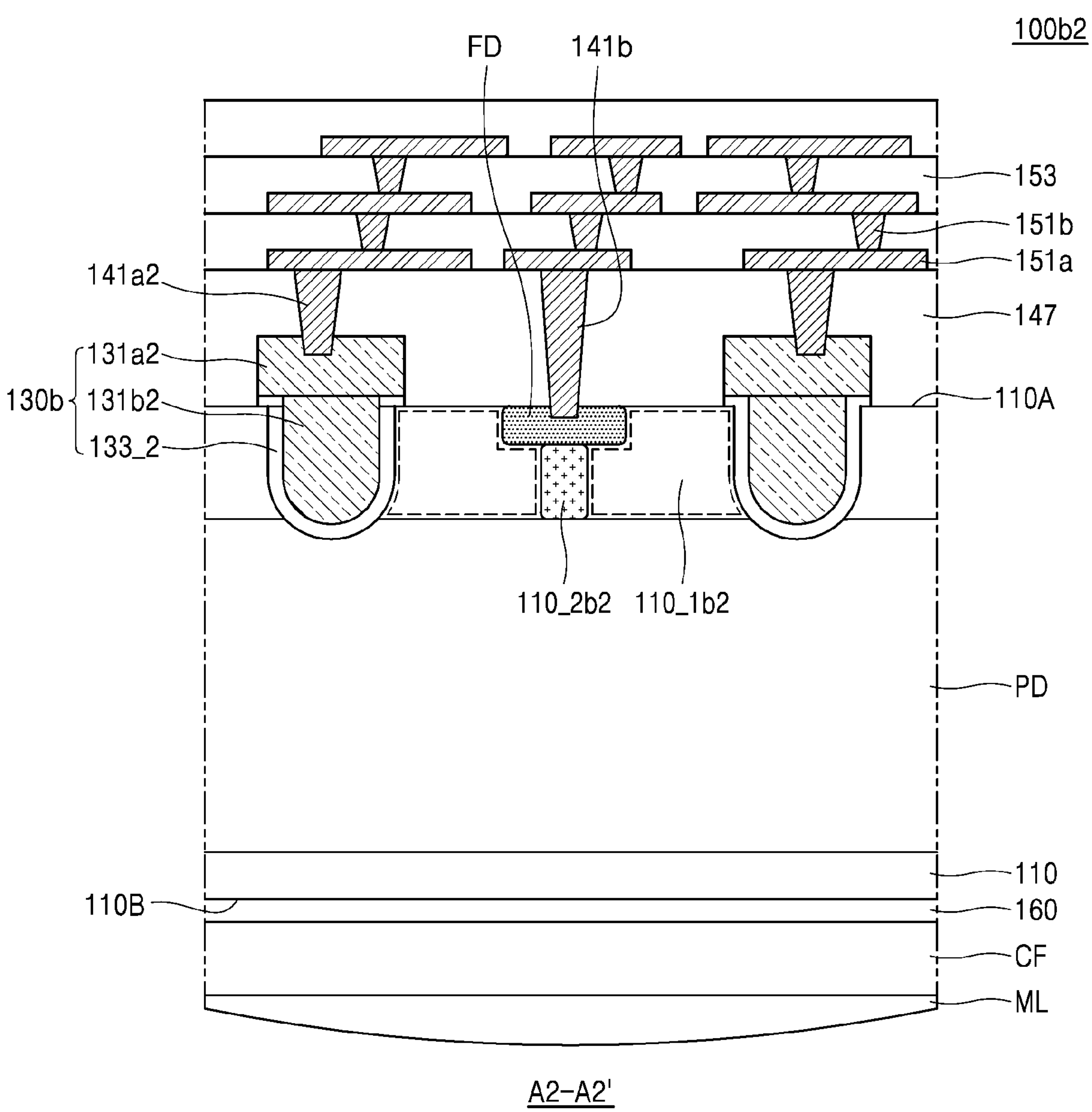
Figure 6C:
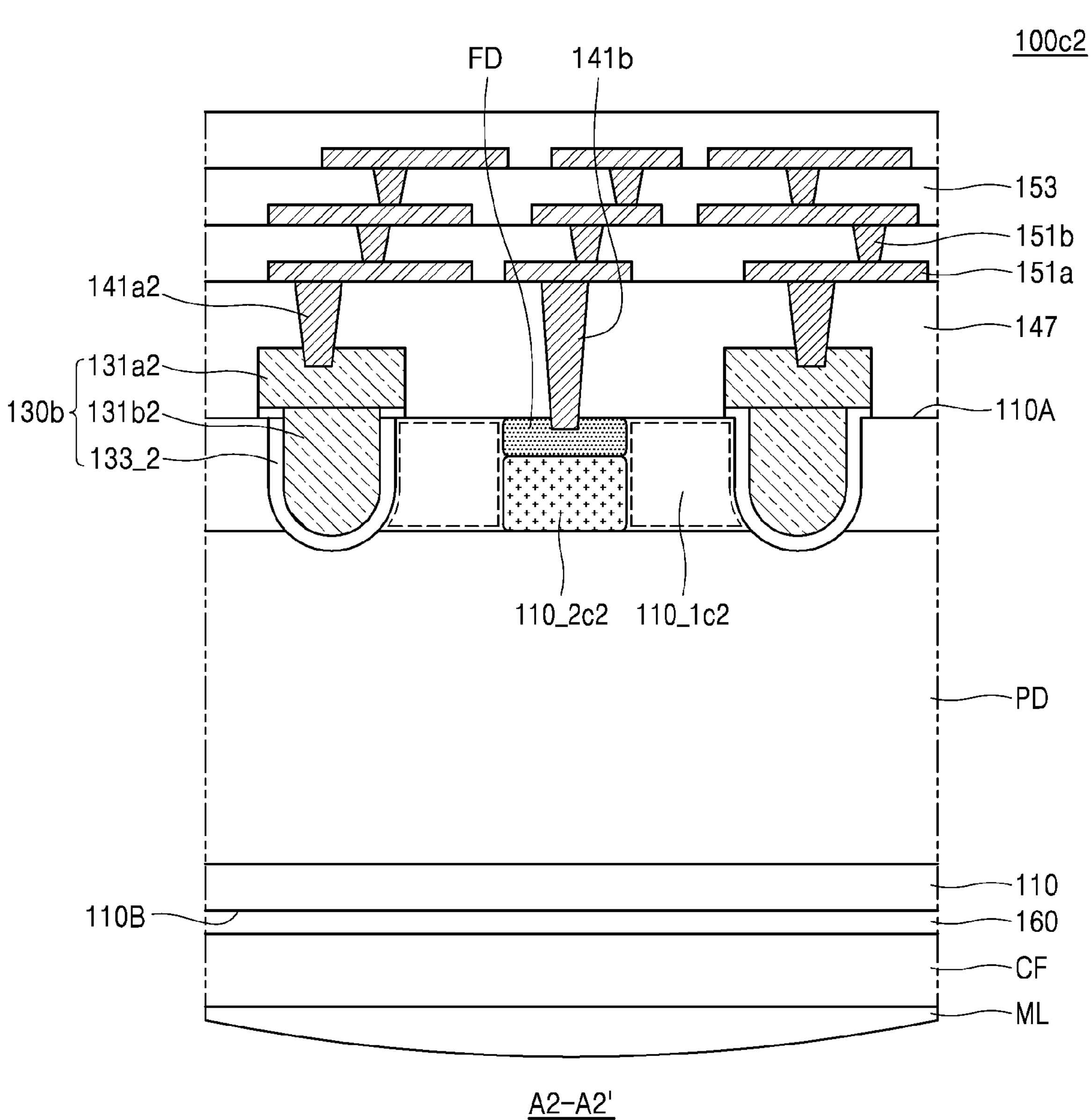

FIGS. 6B and 6C are cross-sectional views corresponding to a cross-section taken along line A2-A2' of FIG. 5. Respective components of image sensors 100*b*2 and 100*c*2 shown in FIGS. 6B and 6C are similar to respective components of the image sensor 100*a*2 described with reference to FIGS. 5 and 6A, and thus, differences therebetween will be mainly described.

Referring to FIG. 6B, the image sensor 100*b*2 may include an intrinsic semiconductor region 110_1*b*2 and an impurity semiconductor region 110_2*b*2. The intrinsic semiconductor region 110_1*b*2 may be between each of two transfer gates 130*b* and a floating diffusion region FD. In this case, the impurity semiconductor region 110_2*b*2 may be in the middle of the intrinsic semiconductor region 110_1*b*2, and the intrinsic semiconductor region 110_1*b*2 be separated by the impurity semiconductor region 110_2*b*2. Accordingly, one side of the intrinsic semiconductor region 110_1*b*2 may be in contact with the transfer gate 130*b*, and another side of the intrinsic semiconductor region 110_1*b*2 may be in contact with the impurity semiconductor region 110_2*b*2 and the floating diffusion region FD. In an embodiment, a partial region of the intrinsic semiconductor region **110_1*b*2, which is at a lower vertical level than the floating diffusion region FD, may extend toward the floating diffusion region FD in the first direction. In this case, the partial region of the intrinsic semiconductor region 110_1*b*2**, which extends in the first direction, may overlap a portion of the floating diffusion region FD in the second direction.

Referring to FIG. 6C, the image sensor **100*c*2 may include an intrinsic semiconductor region 110_1*c*2 and an impurity semiconductor region 110_2*c*2. The intrinsic semiconductor region 110_1*c*2 may be between each of the two transfer gates 130*b* and the floating diffusion region FD. In this case, the impurity semiconductor region 110_2*c*2 may be in the middle of the intrinsic semiconductor region 110_1*c*2, and the intrinsic semiconductor region 110_1*c*2 may be separated by the impurity semiconductor region 110_2*c*2. Accordingly, one side of the intrinsic semiconductor region 110_1*c*2 may be in contact with the transfer gate 130*b*, and another side of the intrinsic semiconductor region 110_1*c*2 may be in contact with the impurity semiconductor region 110_2*c*2 and the floating diffusion region FD. In an embodiment, the intrinsic semiconductor region 110_1*c*2 may not overlap the floating diffusion region FD in the second direction. That is, a partial region of the intrinsic semiconductor region 110_1*c*2**, which is at a lower vertical level than the floating diffusion region FD, may not extend in the first direction.

Figure 7:
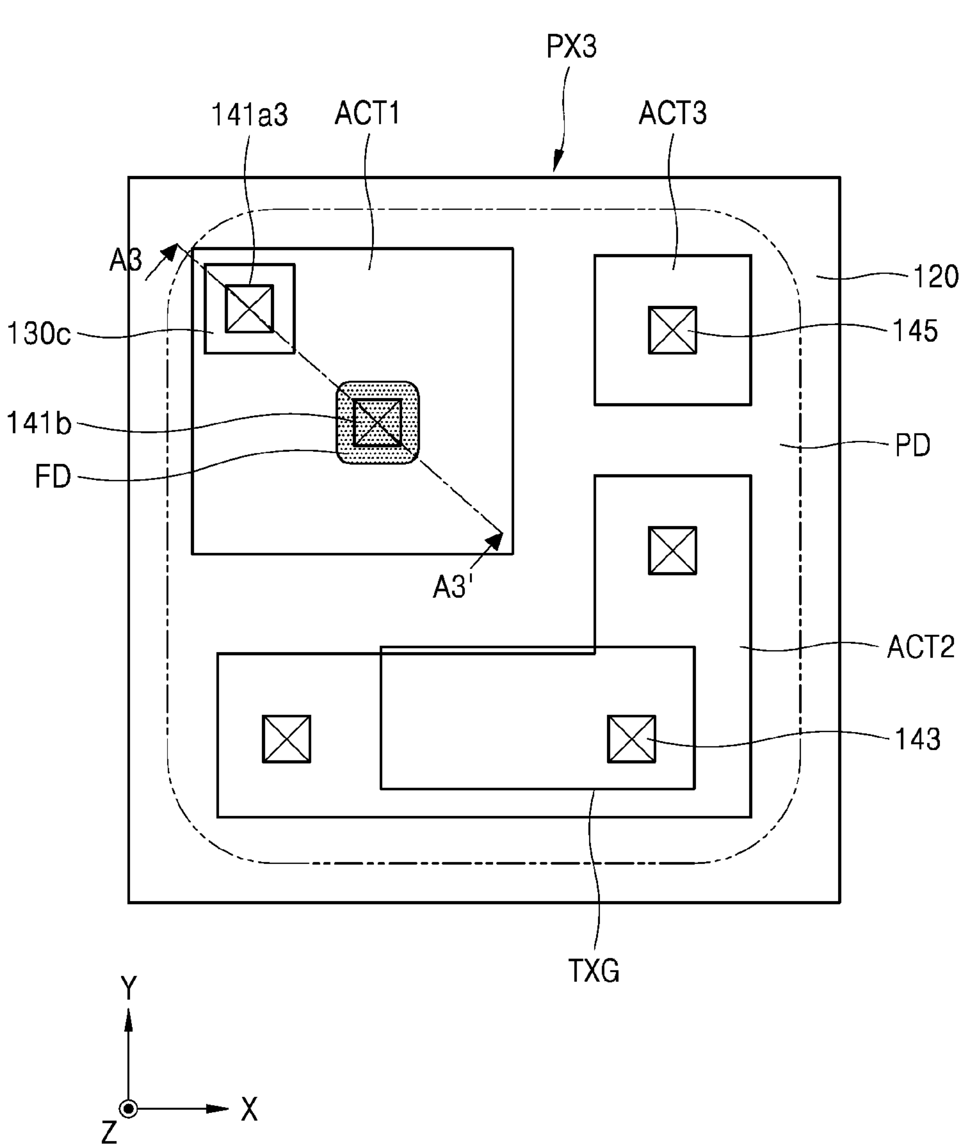
FIG. 7 is a plan view of a pixel of an image sensor, according to an embodiment.
Figure 8A:
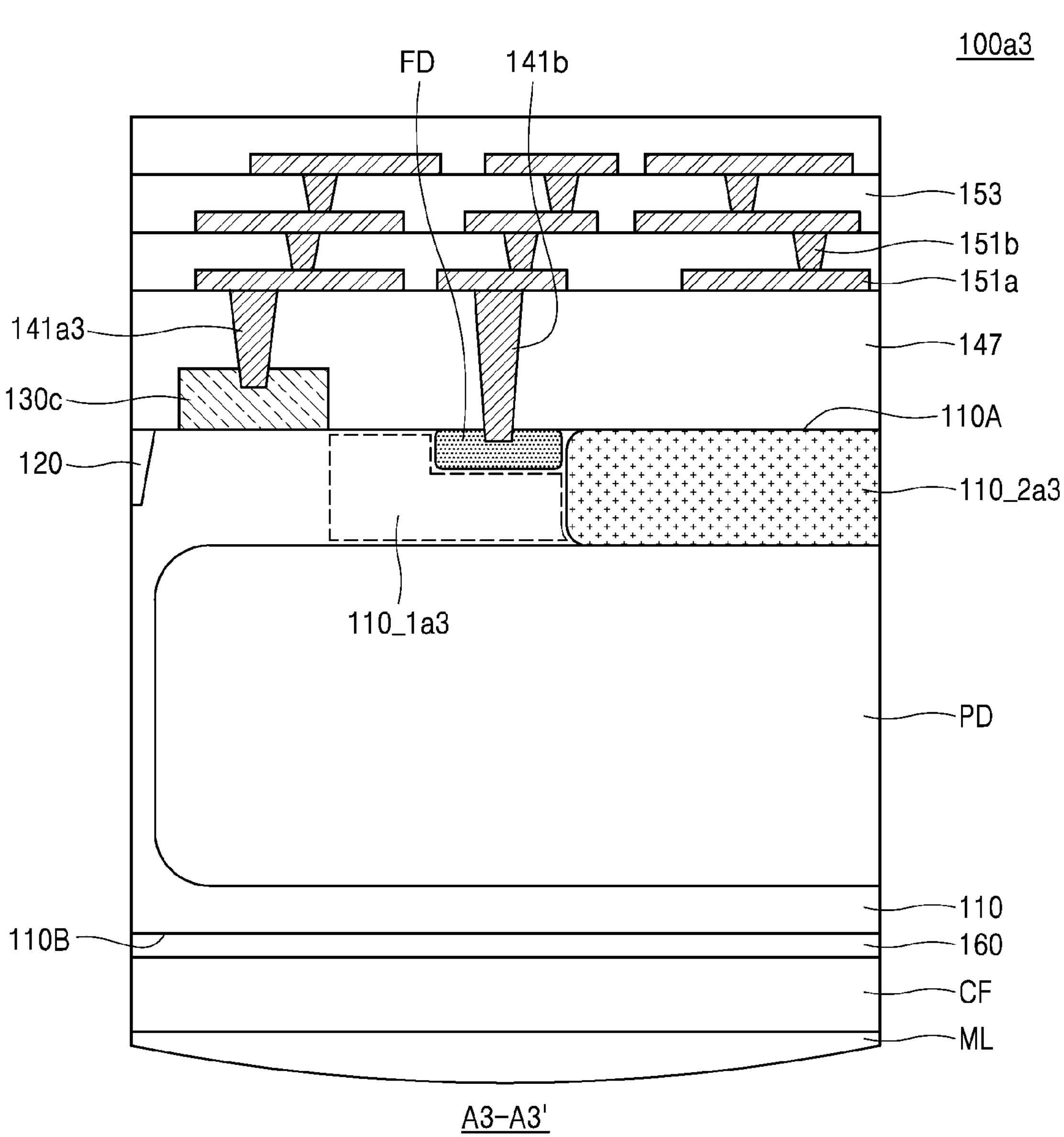
FIGS. 8A to 8D are cross-sectional views taken along line A3-A3' of FIG. 7.

FIG. 7 is a plan view of a pixel of an image sensor **100*a*3 according to an embodiment. FIG. 8A is a cross-sectional view taken along line A3-A3' of FIG. 7. Respective components of the image sensor 100*a*3 shown in FIGS. 7 and 8A are similar to respective components of the image sensor 100 described with reference to FIGS. 3 and 4**A, and thus, differences therebetween will be mainly described.

Referring to FIGS. 7 and 8A, the image sensor **100*a*3 may include a unit pixel PX3, and a transfer transistor (refer to TX in FIG. 2) and a floating diffusion region FD may be in a first active area ACT1 located in the unit pixel PX3. The transfer transistor TX may include a transfer gate 130*c***.

In an embodiment, the transfer gate **130*c* may be a planar transfer gate. Specifically, the transfer gate 130*c* may include only a lateral portion on a front surface 110A of the substrate 110. The transfer gate 130*c* may be connected to the first contact plug 141*a*3. The first contact plug 141*a*3 may pass through a portion of the lateral portion of the transfer gate 130*c***.

An intrinsic semiconductor region **110_1*a*3 may be between the floating diffusion region FD and the transfer gate 130*c*. Because the transfer gate 130*c* is the planar transfer gate, the intrinsic semiconductor region 110_1*a*3 may be at a lower vertical level than the transfer gate 130*c*. Accordingly, the intrinsic semiconductor region 110_1*a*3 and the transfer gate 130*c*** may not be in contact with each other.

In an embodiment, a partial region of the intrinsic semiconductor region **110_1*a*3, which is at a lower vertical level than the floating diffusion region FD, may extend far away from the transfer gate 130*c* in the first direction. In this case, the partial region of the intrinsic semiconductor region 110_1*a*3**, which extends in the first direction, may be under the floating diffusion region FD and overlap the entire floating diffusion region FD in the second direction (i.e., the vertical direction).

An impurity semiconductor region **110_2*a*3 may be on one side of the floating diffusion region FD, which is not adjacent to the transfer gate 130*c*. A partial region of the impurity semiconductor region 110_2*a*3, which is at a lower vertical level than the floating diffusion region FD, may be in contact with the partial region of the intrinsic semiconductor region 110_1*a*3, which extends in the first direction. A remaining region of the impurity semiconductor region 110_2*a*3 except for the partial region of the impurity semiconductor region 110_2*a*3** may be in contact with the floating diffusion region FD.

Figure 8B:
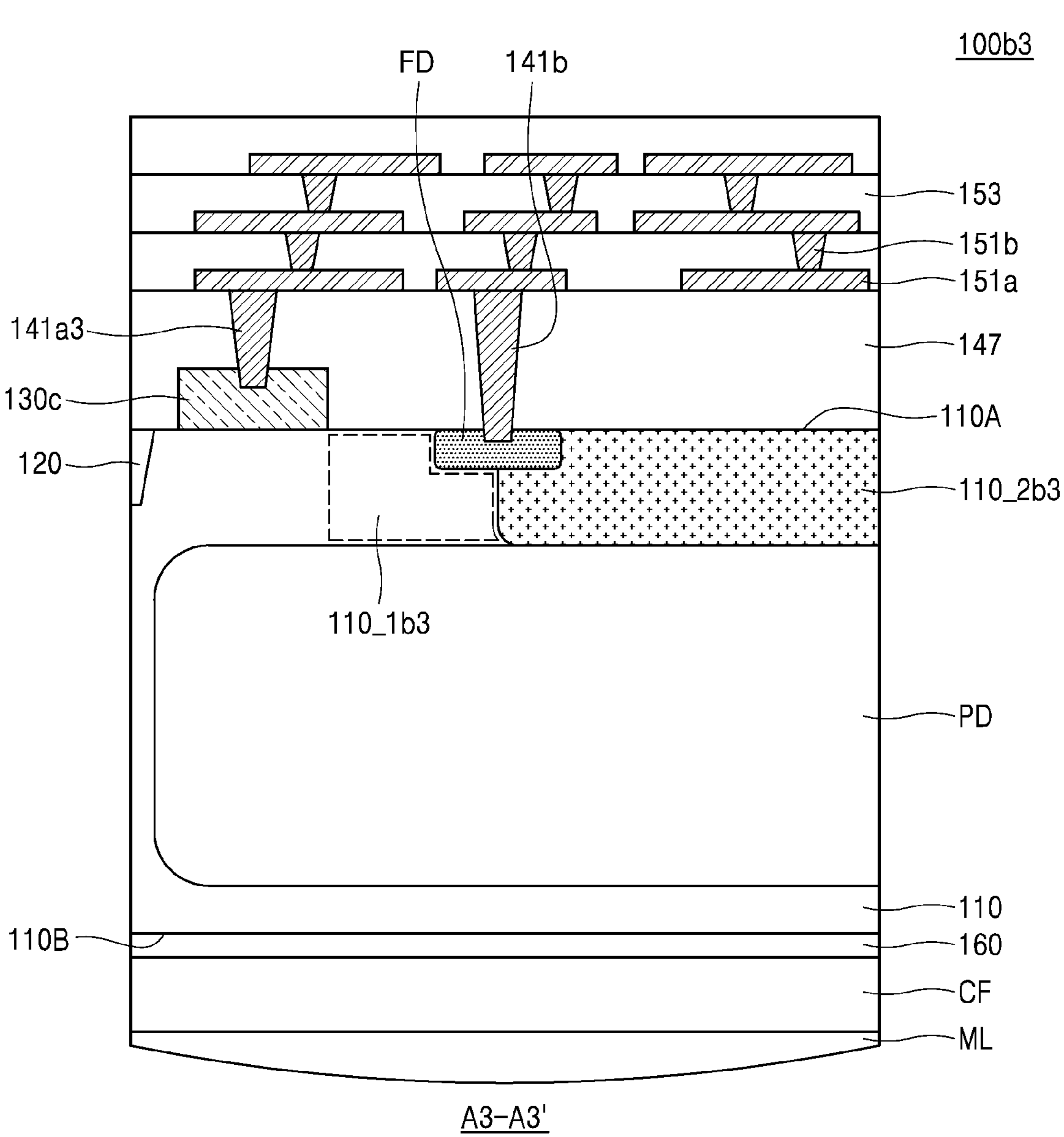
Figure 8C:
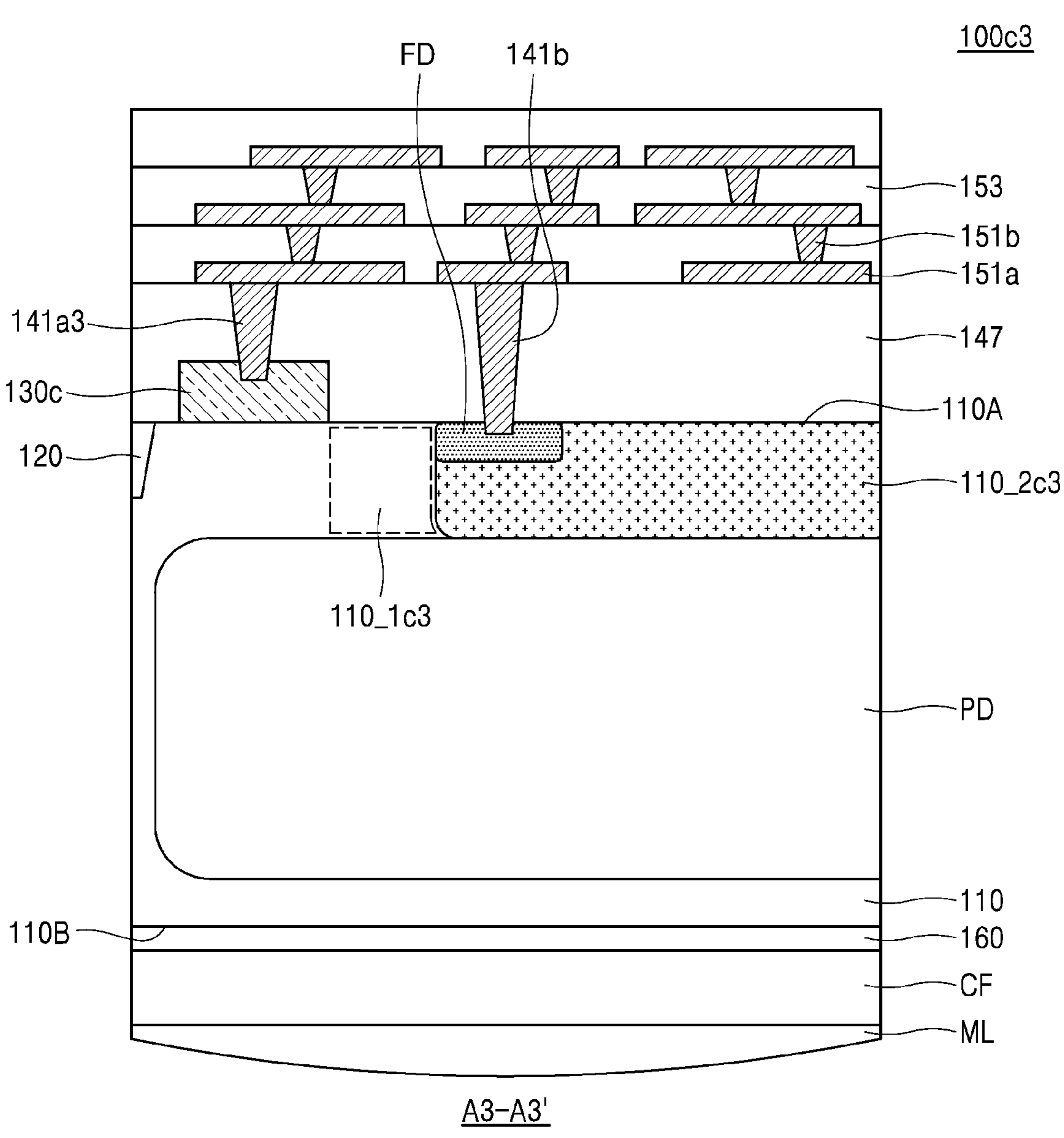
Figure 8D:
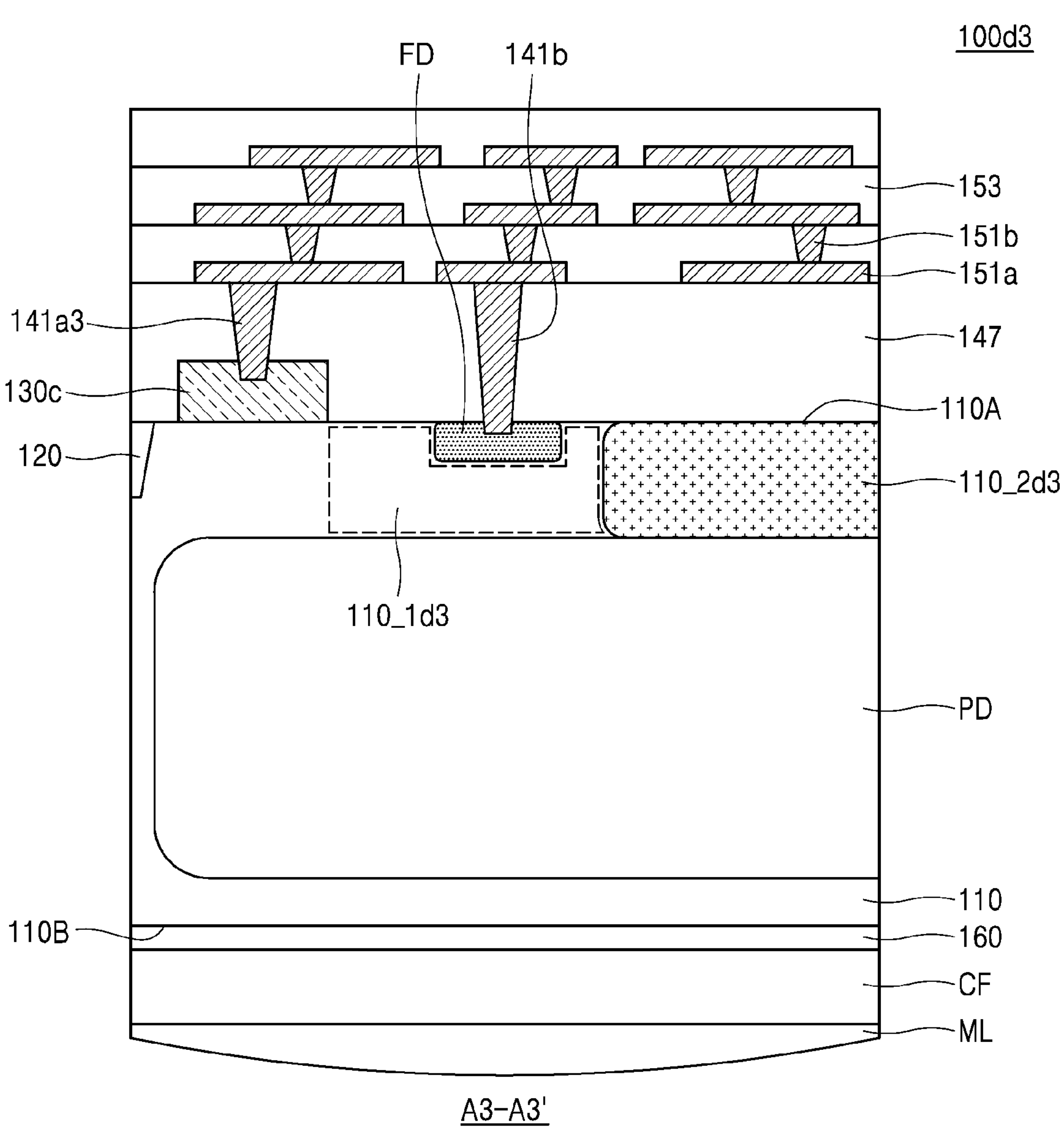

FIGS. 8B to 8D are cross-sectional views corresponding to a cross-section taken along line A3-A3' of FIG. 7. Respective components of image sensors **100*b*3, 100*c*3, and 100*d*3 shown in FIGS. 8B to 8D are similar to respective components of the image sensor 100*a*3 described with reference to FIGS. 7 and 8**A, and thus, differences therebetween will be mainly described.

Referring to FIG. 8B, the image sensor **100*b*3 may include an intrinsic semiconductor region 110_1*b*3 and an impurity semiconductor region 110_2*b*3. The intrinsic semiconductor region 110_1*b*3 may be between a floating diffusion region FD and a transfer gate 130*c*. In an embodiment, a partial region of the intrinsic semiconductor region 110_1*b*3, which is at a lower vertical level than the floating diffusion region FD, may extend toward the floating diffusion region FD in the first direction. In this case, the partial region of the intrinsic semiconductor region 110_1*b*3**, which extends in the first direction, may overlap a portion of the floating diffusion region FD in the second direction.

The impurity semiconductor region **110_2*b*3 may be on one side of the floating diffusion region FD, which is not adjacent to the transfer gate 130*c*. In this case, a partial region of the impurity semiconductor region 110_2*b*3, which is at a lower vertical level than the floating diffusion region FD, may extend toward the floating diffusion region FD in the first direction. In this case, the partial region of the impurity semiconductor region 110_2*b*3, which extends in the first direction, may overlap the remaining partial region of the floating diffusion region FD in the second direction. Also, the partial region of the impurity semiconductor region 110_2*b*3, which extends in the first direction, may be in contact with the partial region of the intrinsic semiconductor region 110_1*b*3**, which extends in the first direction.

Referring to FIG. 8C, the image sensor **100*c*3 may include an intrinsic semiconductor region 110_1*c*3 and an impurity semiconductor region 110_2*c*3. The intrinsic semiconductor region 110_1*c*3 may be between a floating diffusion region FD and a transfer gate 130*c*. In an embodiment, the intrinsic semiconductor region 110_1*c*3 may not overlap the floating diffusion region FD in the second direction. That is, a partial region of the intrinsic semiconductor region 110_1*c*3**, which is at a lower vertical level than the floating diffusion region FD, may not extend in the first direction.

The impurity semiconductor region **110_2*c*3 may be on one side of the floating diffusion region FD, which is not adjacent to the transfer gate 130*c*. In this case, a partial region of the impurity semiconductor region 110_2*c*3, which is at a lower vertical level than the floating diffusion region FD, may extend toward the transfer gate 130*c* in the first direction. In this case, the partial region of the impurity semiconductor region 110_2*c*3, which extends in the first direction, may overlap the entire floating diffusion region FD in the second direction. Also, the partial region of the impurity semiconductor region 110_2*c*3, which extends in the first direction, may be in contact with the partial region of the intrinsic semiconductor region 110_1*c*3**, which is at the lower vertical level than the floating diffusion region FD.

Referring to FIG. 8D, the image sensor **100*d*3 may include an intrinsic semiconductor region 110_1*d*3 and an impurity semiconductor region 110_2*d*3**.

The intrinsic semiconductor region **110_1*d*3 may be between a floating diffusion region FD and a transfer gate 130*c* in the first direction. The intrinsic semiconductor region 110_1*d*3 may also be between the floating diffusion region FD and the impurity semiconductor region 110_2*d*3 in the first direction. The intrinsic semiconductor region 110_1*d*3** may surround the floating diffusion region FD.

The impurity semiconductor region **110_2*d*3 may be disposed apart from the floating diffusion region FD on one side of the floating diffusion region FD, which is not adjacent to the transfer gate 130*c*. In this case, the impurity semiconductor region 110_2*d*3 may be in contact with one side of the intrinsic semiconductor region 110_1*d*3**, which surrounds the floating diffusion region FD.

Figure 9:
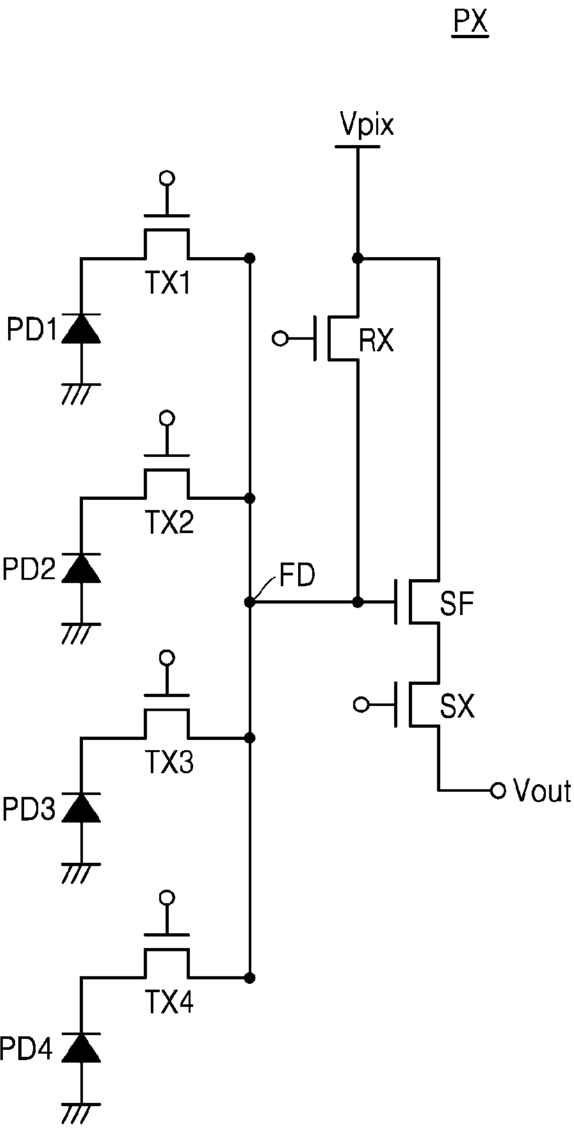
FIG. 9 is a circuit diagram of a pixel array of an image sensor according to an embodiment.

FIG. 9 is a circuit diagram of a pixel array of an image sensor, according to an embodiment.

Referring to FIG. 9, a unit pixel PX may constitute a 4-shared pixel including first to fourth photodiodes PD1, PD2, PD3, and PD4. In this case, the first to fourth photodiodes PD1, PD2, PD3, and PD4 may share one floating diffusion region FD with each other.

In the unit pixel PX, the first to fourth photodiodes PD1, PD2, PD3, and PD4 may share the one floating diffusion region FD with each other by using first to fourth transfer transistors TX1, TX2, TX3, and TX4 corresponding respectively to the first to fourth photodiodes PD1, PD2, PD3, and PD4. For example, the first transfer transistor TX1 corresponding to the first photodiode PD1, the second transfer transistor TX2 corresponding to the second photodiode PD2, the third transfer transistor TX3 corresponding to the third photodiode PD3, and the fourth transfer transistor TX4 corresponding to the fourth photodiode PD4 may share one floating diffusion region FD as a common drain region with each other.

As shown in FIG. 9, in the unit pixel PX, a reset transistor RX, a source follower transistor SF, and a selection transistor SX may be shared among the first to fourth photodiodes PD1, PD2, PD3, and PD4.

As shown in FIG. 9, the first to fourth photodiodes PD1, PD2, PD3, and PD4 may constitute source regions of the first to fourth transfer transistors TX1, TX2, TX3, and TX4 corresponding respectively thereto. The floating diffusion region FD may constitute a common drain region of the first to fourth transfer transistors TX1, TX2, TX3, and TX4. The floating diffusion region FD may be connected to each of a source region of the reset transistor RX and a gate electrode of the source follower transistor SF. A drain region of the reset transistor RX and a drain region of the source follower transistor SF may be sheared with each other and connected to a power supply voltage Vpix. A source region of the source follower transistor SF and a drain region of the selection transistor SX may be shared with each other. An output line Vout may be connected to a source region of the selection transistor SX.

The unit pixel PX is illustrated as constituting a 4-shared pixel including the first to fourth photodiodes PD1, PD2, PD3, and PD4 in FIG. 9, but aspects of the inventive concept are not limited thereto. For example, the unit pixel PX may constitute an N-shared pixel including N photodiodes (N is an integer of 2 or more). Specifically, each of a plurality of pixel units PX included in the image sensor may include a 2-shared pixel including 2 photodiodes or an 8-shared pixel including 8 photodiodes.

Figure 10:
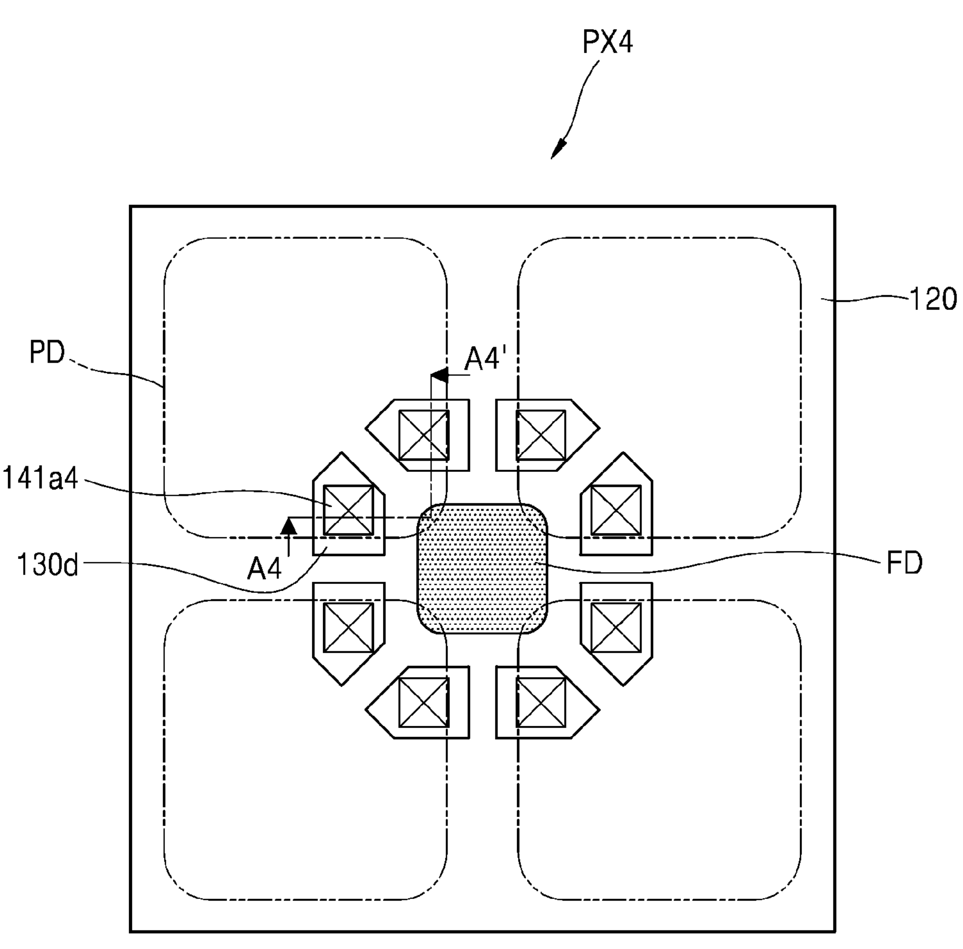
FIG. 10 is a plan view of a pixel of an image sensor, according to an embodiment.
Figure 11A:
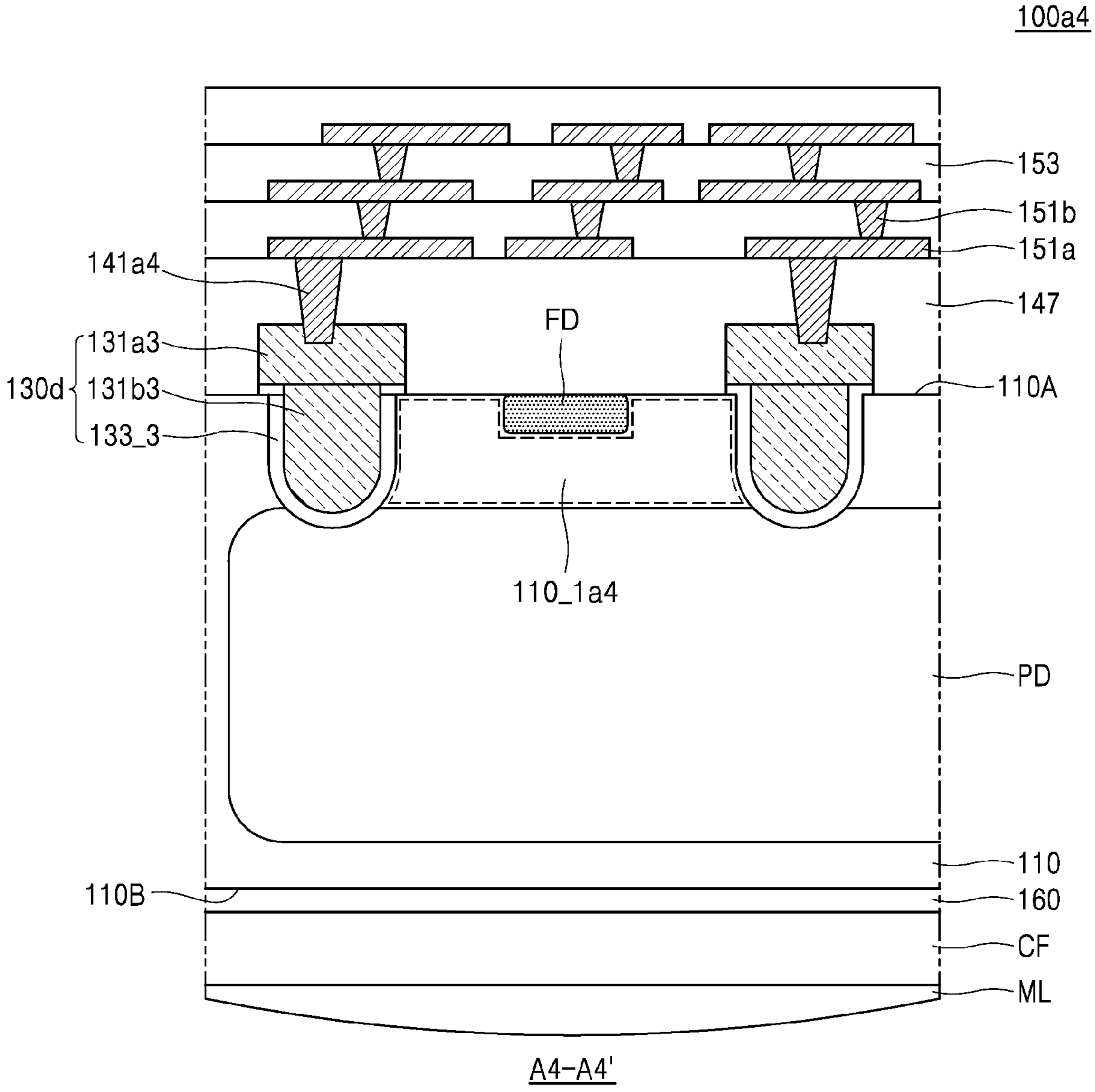
FIGS. 11A to 11C are cross-sectional views taken along line A4-A4' of FIG. 10.

FIG. 10 is a plan view of a pixel of an image sensor **100*a*4, according to an embodiment. FIG. 11A is a cross-sectional view taken along line A4-A4' of FIG. 10**.

Referring to FIGS. 10 and 11A, the image sensor **100*a*4 may include a unit pixel PX4. The unit pixel PX4 may include four photoelectric conversion regions PD, which are formed on a substrate 110. A floating diffusion region FD may be in the center of the unit pixel PX4**. The four photoelectric conversion regions PD may share the floating diffusion region FD with each other and be outside the floating diffusion region FD to surround the floating diffusion region FD.

Two transfer gates **130*d* may be in each of the four photoelectric conversion regions PD. The two transfer gates 130*d* may be disposed apart from the floating diffusion region FD by the same distance as each other. In an embodiment, each of the two transfer gates 130*d* may include a VTG. Specifically, each of the two transfer gates 130*d* may include a lateral portion 131*a*3, a vertical portion 131*b*3, and a gate insulating layer 133_3. The lateral portion 131*a*3 may be on a front surface 110A of the substrate 110. The vertical portion 131*b*3 may be connected to the lateral portion 131*a*3 and extend into the substrate 110 from the front surface 110A of the substrate 110. The gate insulating layer 133_3 may cover a bottom surface of the lateral portion 131*a*3 and a sidewall of the vertical portion 131*b*3**.

The two transfer gates **130*d* may be respectively connected to first contact plugs 141*a*4. The first contact plugs 141*a*4 may respectively pass through portions of the lateral portions 131*a*3 of the two transfer gates 130*d***.

An intrinsic semiconductor region **110_1*a*4 may be disposed between a first of the two transfer gates 130*d* and the floating diffusion region FD in the first direction. The intrinsic semiconductor region 110_1*a*4 may also be disposed between a second of the two transfer gates 130*d* and the floating diffusion region FD in the first direction. The intrinsic semiconductor region 110_1*a*4 may also be disposed between the floating diffusion region FD and the photoelectric conversion regions PD in the second direction. The floating diffusion region FD may be surrounded by the intrinsic semiconductor region 110_1*a*4**.

Figure 11B:
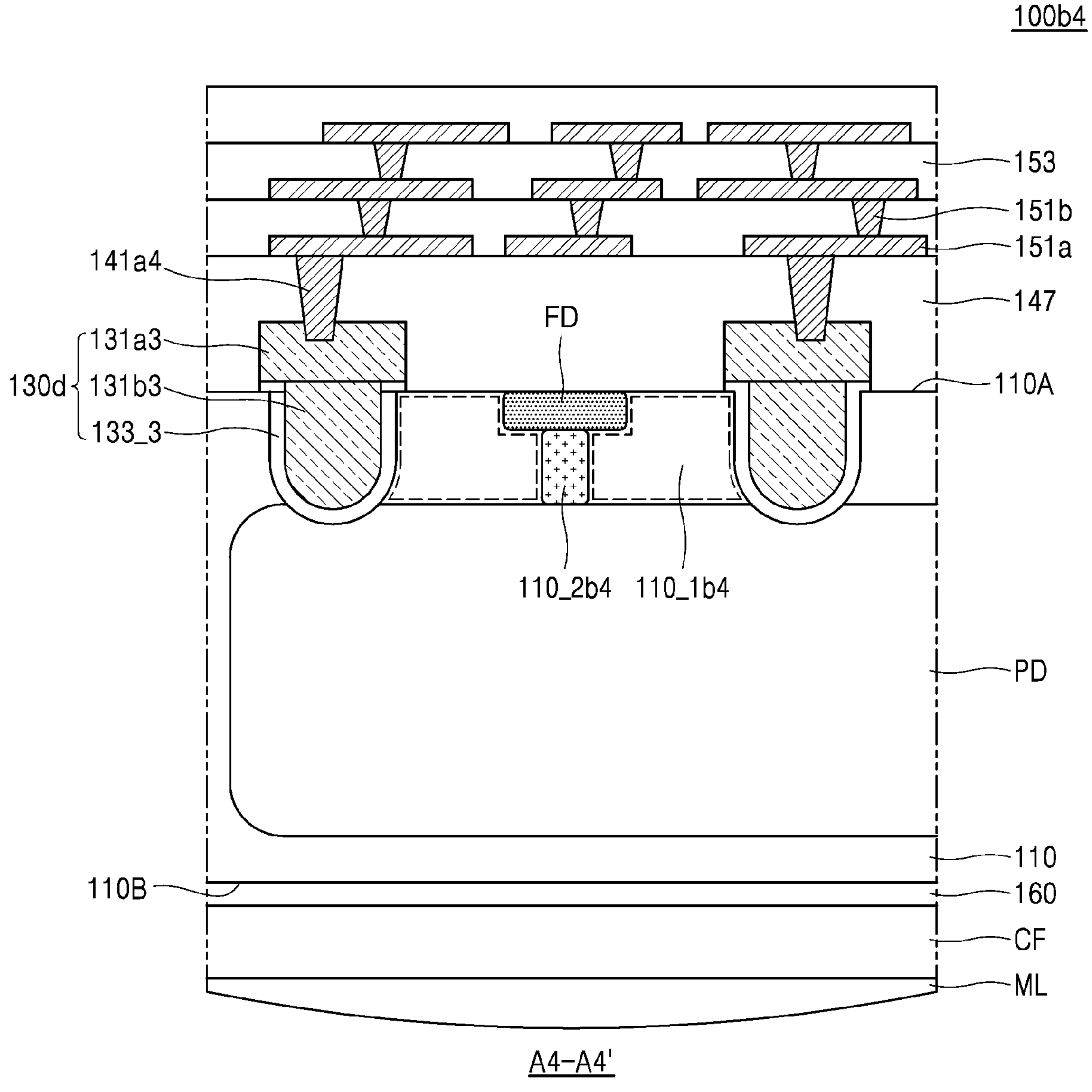
Figure 11C:
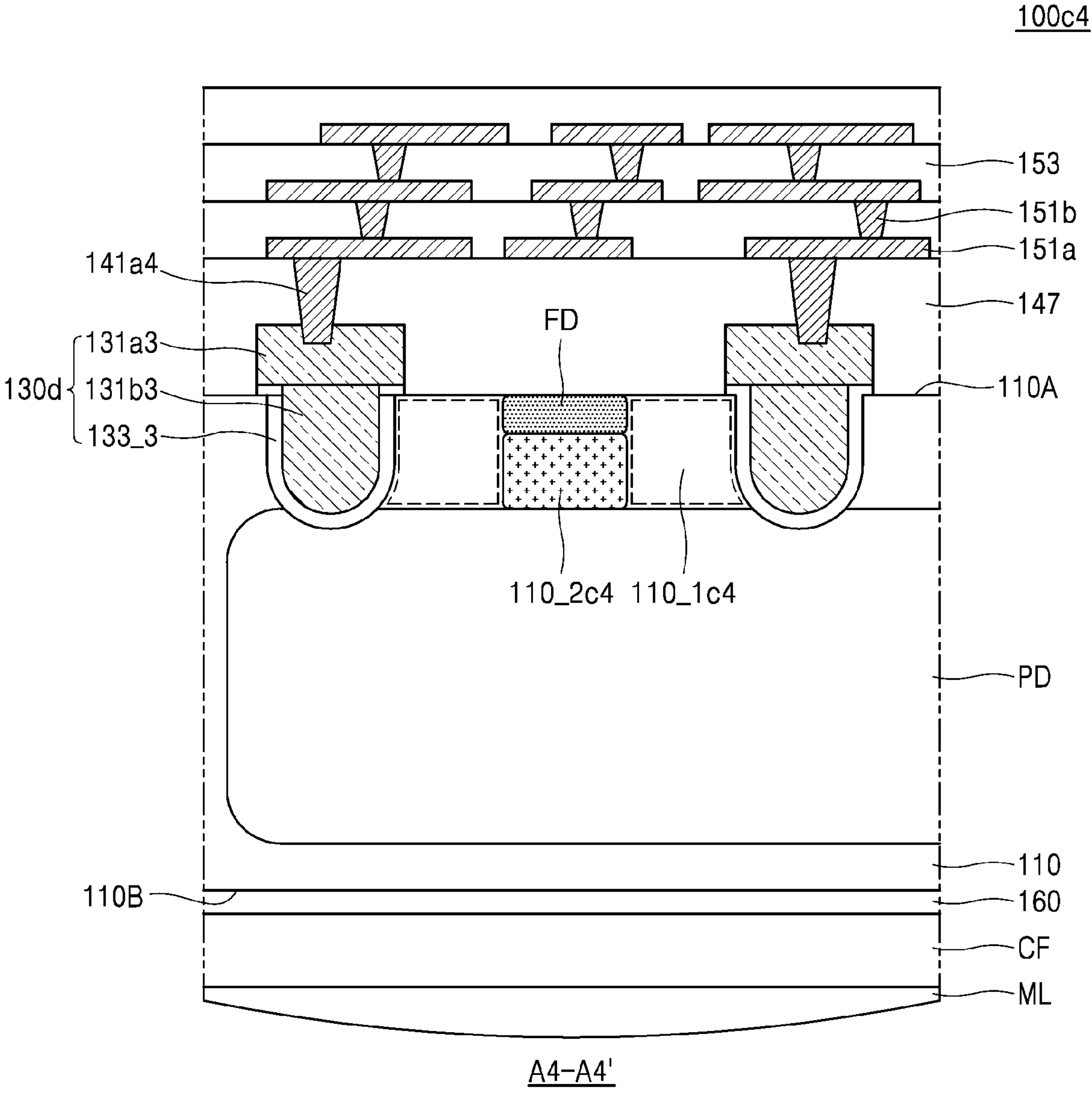

FIGS. 11B and 11C are cross-sectional views corresponding to a cross-section taken along line A4-A4' of FIG. 10. Respective components of image sensors **100*b*4 and 100*c*4 shown in FIGS. 11B and 11C are similar to respective components of the image sensor 100*a*4 described with reference to FIGS. 10 and 11**A, and thus, differences therebetween will be mainly described.

Referring to FIG. 11B, the image sensor **100*b*4 may include an intrinsic semiconductor region 110_1*b*4 and an impurity semiconductor region 110_2*b*4. The intrinsic semiconductor region 110_1*b*4 and the impurity semiconductor region 110_2*b*4 may be respectively similar to the intrinsic semiconductor region 110_1*b*2 and the impurity semiconductor region 110_2*b*2, which have been described with reference to FIGS. 6**B, and thus, detailed descriptions thereof are omitted.

Referring to FIG. 11C, the image sensor **100*c*4 may include an intrinsic semiconductor region 110_1*c*4 and an impurity semiconductor region 110_2*c*4. The intrinsic semiconductor region 110_1*c*4 and the impurity semiconductor region 110_2*c*4 may be respectively similar to the intrinsic semiconductor region 110_1*c*2 and the impurity semiconductor region 110_2*c*2, which have been described with reference to FIG. 6**C, and thus, detailed descriptions thereof are omitted.

Figure 12:
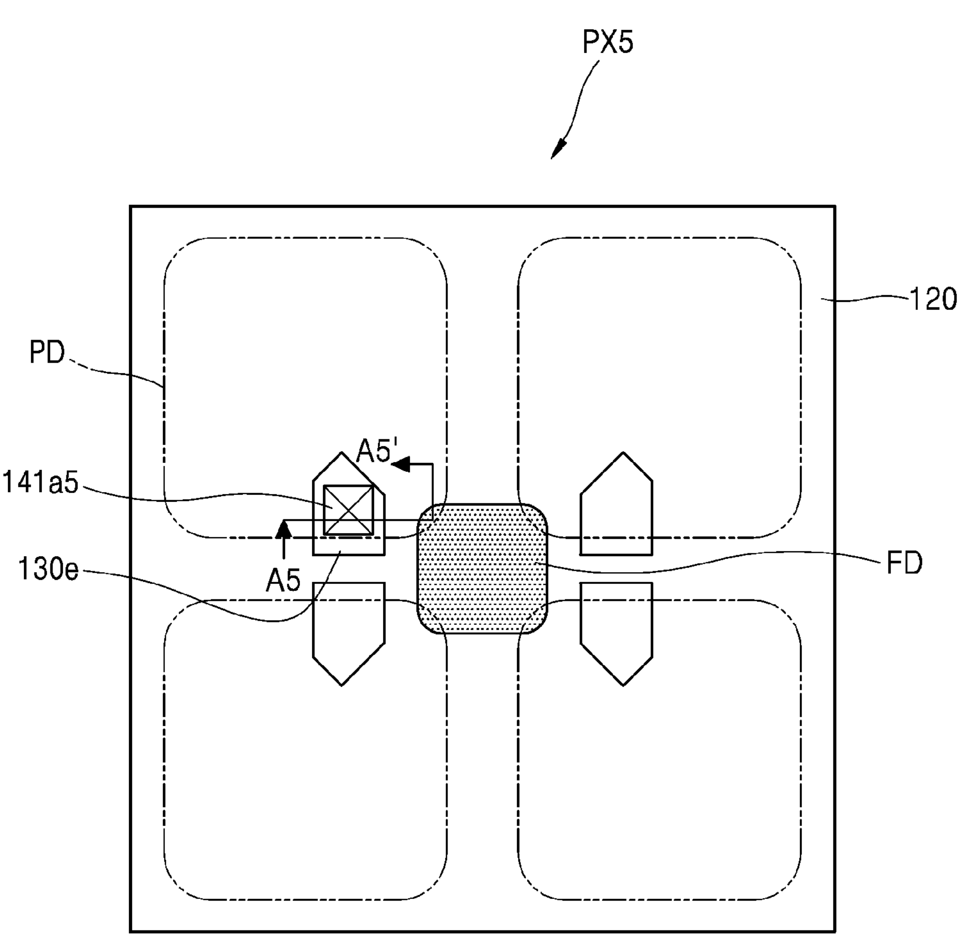
FIG. 12 is a plan view of a pixel of an image sensor, according to an embodiment.
Figure 13A:
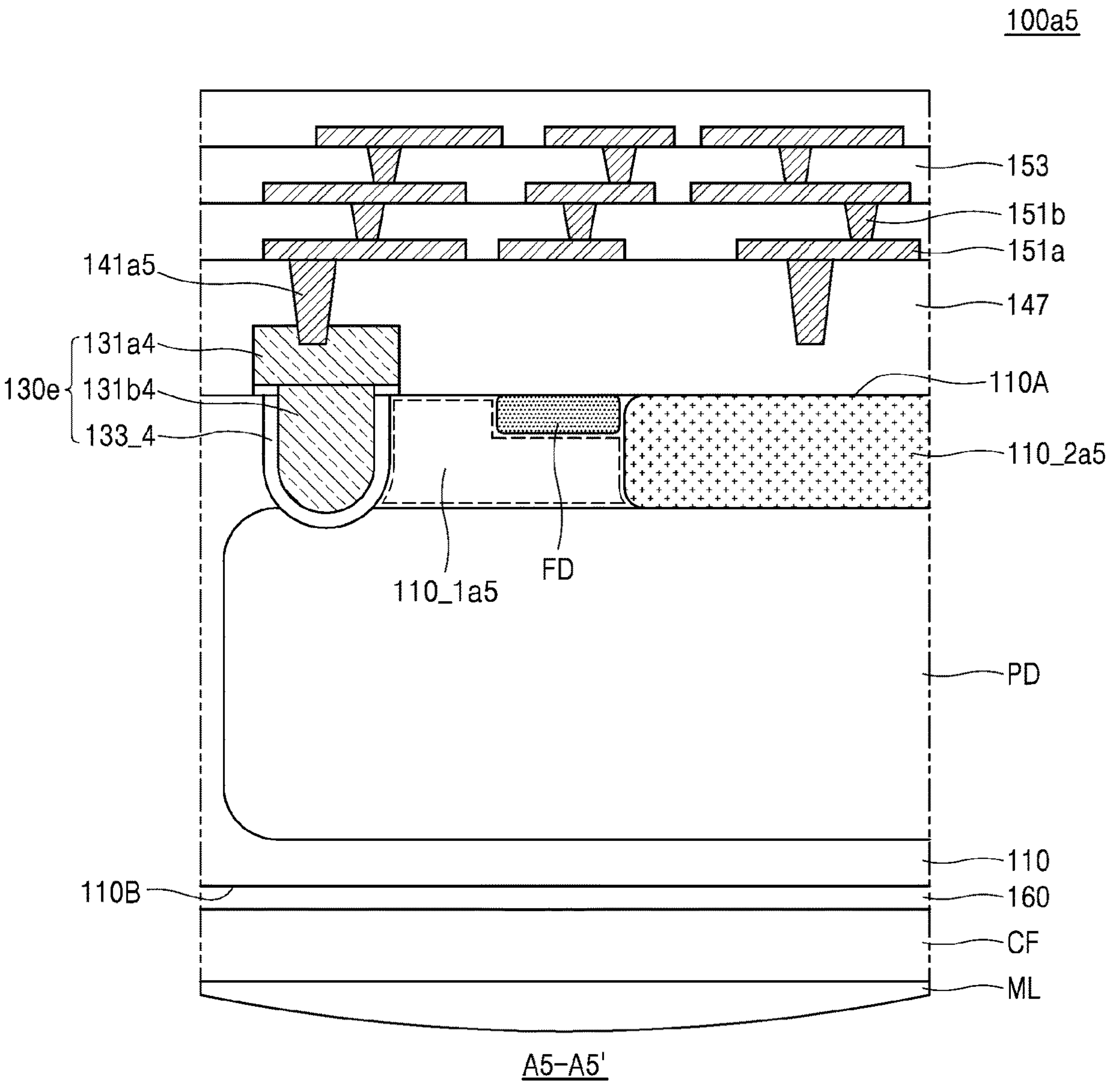
FIGS. 13A to 13C are cross-sectional views taken along line A5-A5' of FIG. 12.

FIG. 12 is a plan view of a pixel of an image sensor **100*a*5, according to an embodiment. FIG. 13A is a cross-sectional view taken along line A5-A5' of FIG. 12. Respective components of the image sensor 100*a*5** shown in FIGS.

12 and 13A are similar to respective components of the image sensor 100_a_4 described with reference to FIGS. 10 and 11A, and thus, differences therebetween will be mainly described.

Referring to FIGS. 12 and 13A, the image sensor 100_a_5 may include a unit pixel PX5 in which four photoelectric conversion regions PD are arranged. A transfer gate 130_e_ may be in each of the four photoelectric conversion regions PD. In an embodiment, the transfer gate 130_e_ may be a VTG. Specifically, the transfer gate 130_e_ may include a lateral portion 131_a_4, a vertical 131_b_4, and a gate insulating layer 133_4. The lateral portion 131_a_4 may be on a front surface 110A of a substrate 110. The vertical portion 131_b_4 may be connected to the lateral portion 131_a_4 and extend into the substrate 110 from the front surface 110A of the substrate 110. The gate insulating layer 133_4 may cover a bottom surface of the lateral portion 131_a_4 and a sidewall of the vertical portion 131_b_4.

The transfer gate 130_e_ may be connected to first contact plugs 141_a_5. The first contact plugs 141_a_5 may pass through a portion of the lateral portion 131_a_4 of the transfer gate 130_e_.

An intrinsic semiconductor region 110_1_a_5 may be between a floating diffusion region FD and the transfer gate 130_e_.

In an embodiment, a partial region of the intrinsic semiconductor region 110_1_a_5, which is at a lower vertical level than the floating diffusion region FD, may extend away from the transfer gate 130_e_ in the first direction. In this case, the partial region of the intrinsic semiconductor region 110_1_a_5, which extends in the first direction, may be disposed under the floating diffusion region FD and overlap the entire floating diffusion region FD in the second direction (i.e., the vertical direction).

The impurity semiconductor region 110_2_a_5 may be on one side of the floating diffusion region FD, which is not adjacent to the transfer gate 130_e_. A partial region of the impurity semiconductor region 110_2_a_5, which is at a lower vertical level than the floating diffusion region FD, may be in contact with the partial region of the intrinsic semiconductor region 110_1_a_5, which extends in the first direction. A remaining region of the impurity semiconductor region 110_2_a_5, except for the partial region of the impurity semiconductor region 110_2_a_5, may be in contact with the floating diffusion region FD.

Figure 13B:
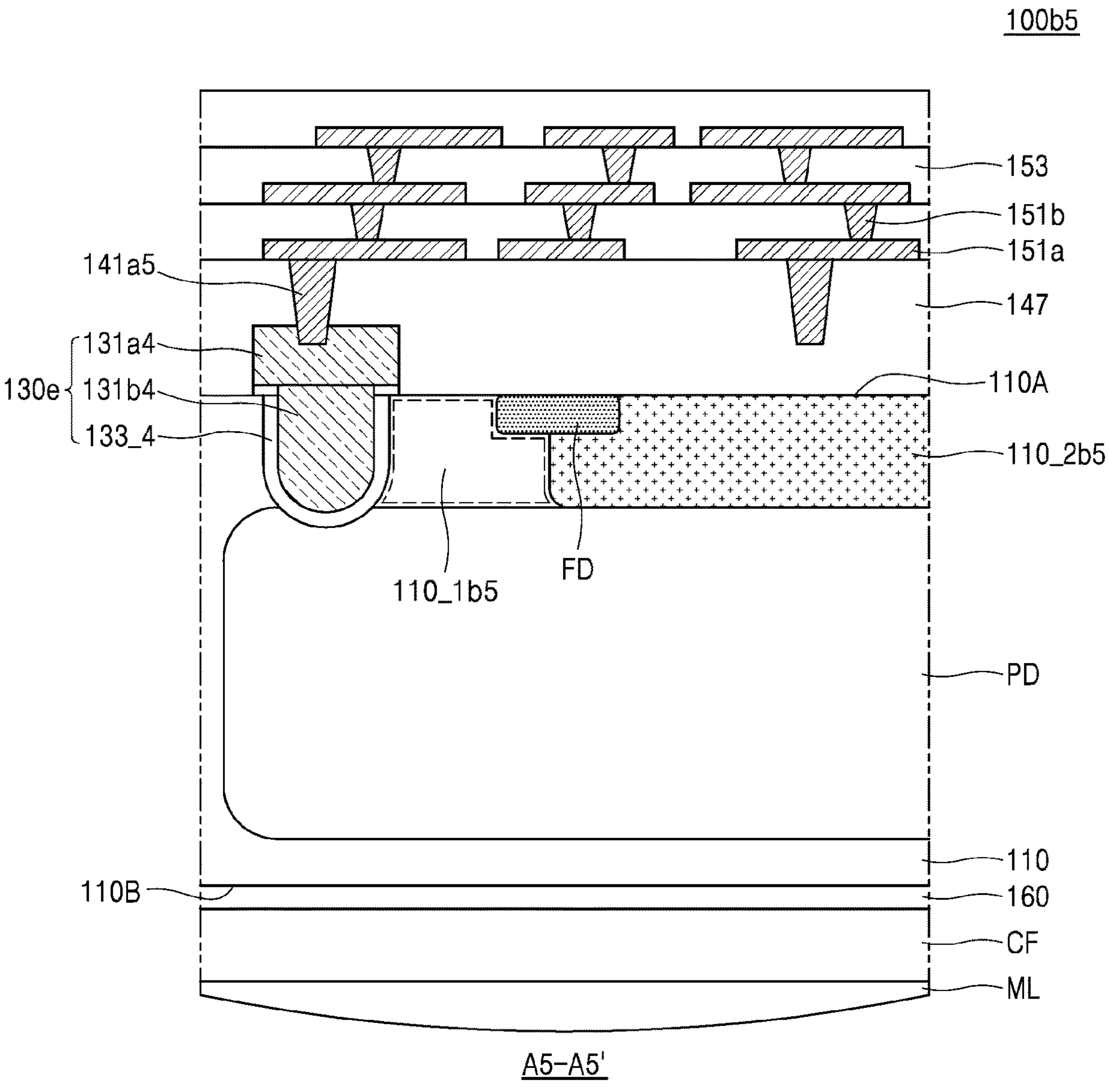
Figure 13C:
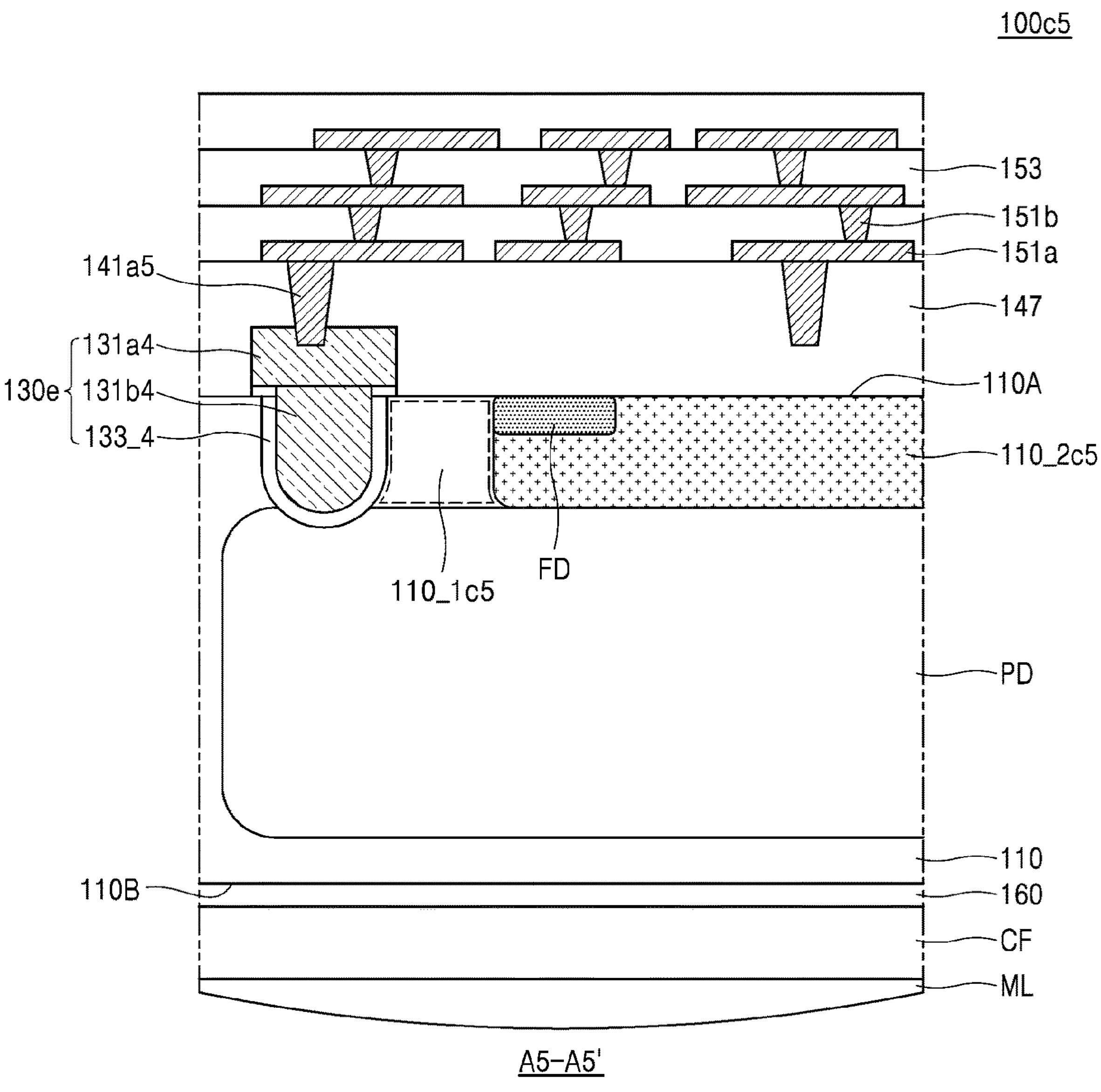

FIGS. 13B and 13C are cross-sectional views corresponding to a cross-section taken along line A5-A5' of FIG. 12. Respective components of image sensors 100_b_5 and 100_c_5 shown in FIGS. 13B and 13C are similar to respective components of the image sensor 100_a_5 described with reference to FIGS. 12 and 13A, and thus, differences therebetween will be mainly described.

Referring to FIG. 13B, the image sensor 100_b_5 may include an intrinsic semiconductor region 110_1_b_5 and an impurity semiconductor region 110_2_b_5. The intrinsic semiconductor region 110_1_b_5 and the impurity semiconductor region 110_2_b_5 may be respectively similar to the intrinsic semiconductor region 110_1_a_1 and the impurity semiconductor region 110_2_a_1, which have been described with reference to FIG. 4B, and thus, detailed descriptions thereof are omitted.

Referring to FIG. 13C, the image sensor 100_c_5 may include an intrinsic semiconductor region 110_1_c_5 and an impurity semiconductor region 110_2_c_5. The intrinsic semiconductor region 110_1_c_5 and the impurity semiconductor region 110_2_c_5 may be respectively similar to the intrinsic semiconductor region 110_1_b_1 and the impurity semiconductor region 110_2_b_1, which have been described with reference to FIG. 4C, and thus, detailed descriptions thereof are omitted.

FIGS. 14A to 14E are cross-sectional views of a method of manufacturing an image sensor 100, according to embodiments.

Figure 14A:
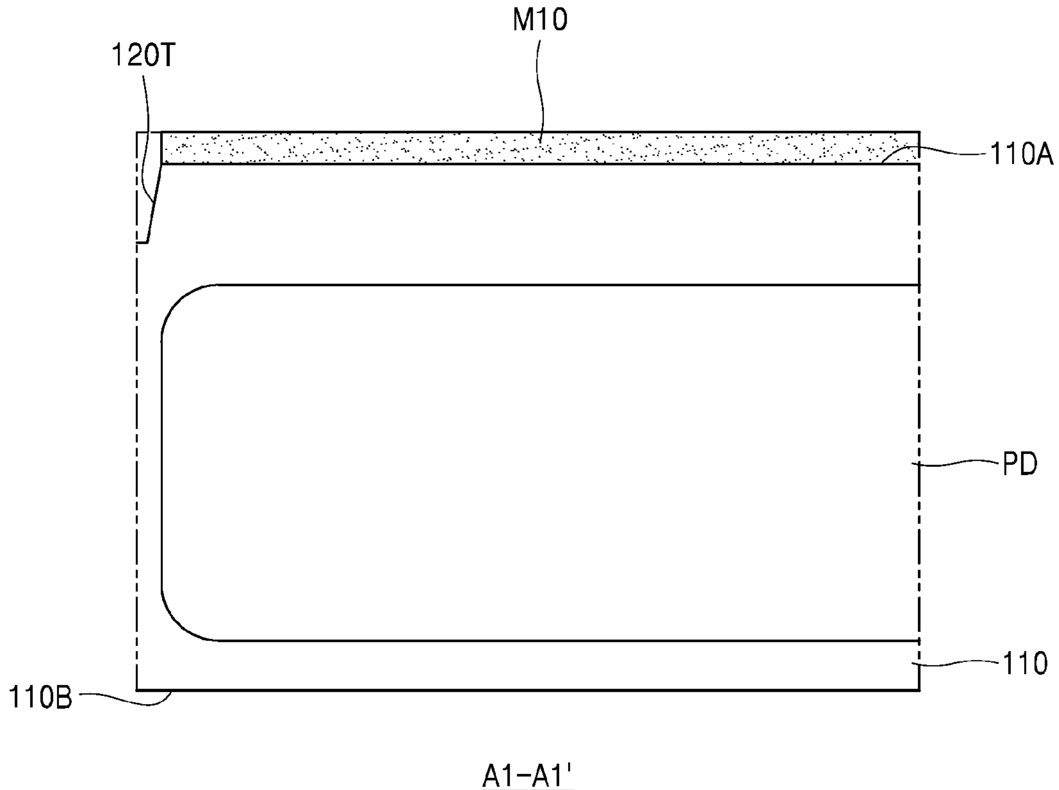
FIGS. 14A to 14E are cross-sectional views of a method of manufacturing an image sensor, according to an embodiment.

Referring to FIG. 14A, a first mask pattern M10 may be formed on a front surface 110A of a substrate 110, and a device isolation trench 120T may be formed in the substrate 110 by using the first mask pattern M10 as an etch mask.

Figure 14B:
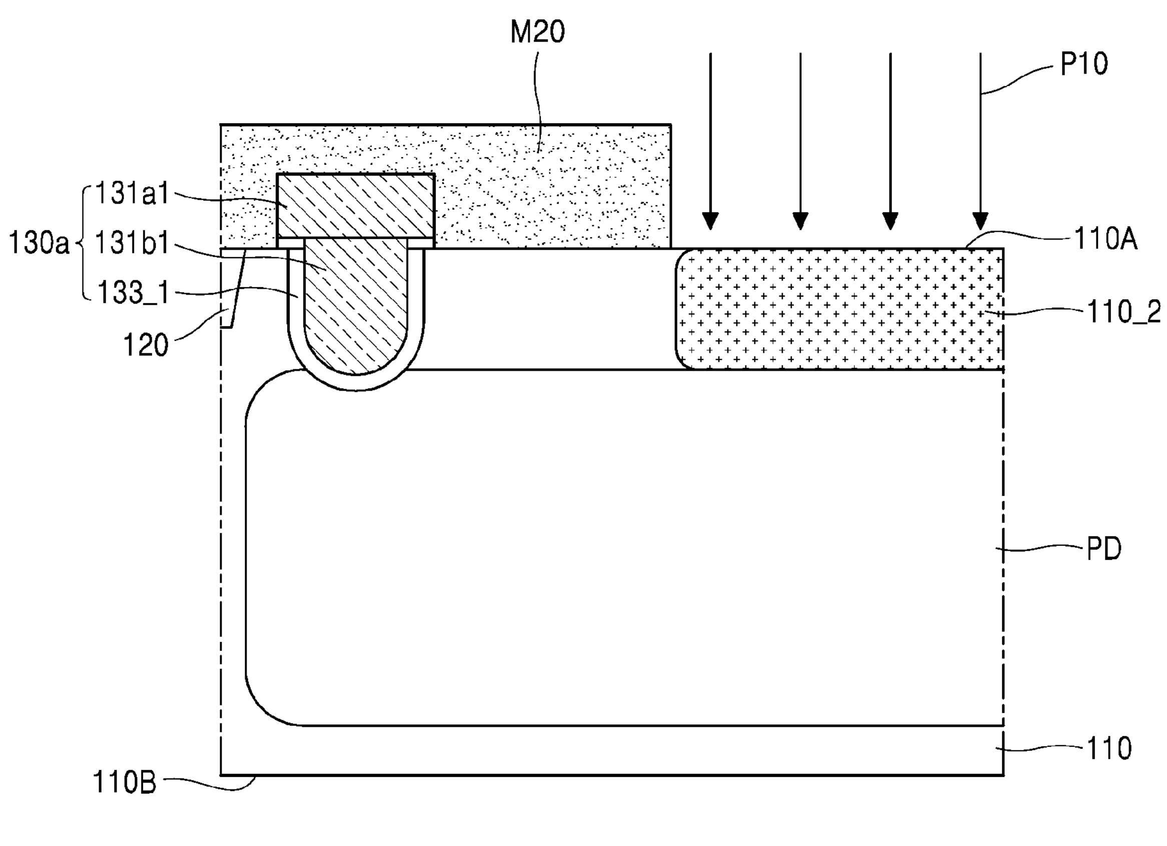

Referring to FIG. 14B, in the resultant structure of FIG. 14A, a device isolation film 120 may be formed in the device isolation trench 120T. Thereafter, a mask pattern (not shown) may be formed on the front surface 110A of the substrate 110, and a portion of the substrate 110 may be removed by using the mask pattern as an etch mask to form a transfer gate trench (not shown), and a transfer gate 130_a_ may be formed inside the transfer gate trench. Next, a first ion implantation mask M20 may be formed on the front surface 110A of the substrate 110, and first impurities may be implanted into the substrate 110 by using the first ion implantation mask M20 due to an ion implantation process P10, and thus, an impurity semiconductor region 110_2 may be formed. The first impurities may be, for example, p-type impurities.

Figure 14C:
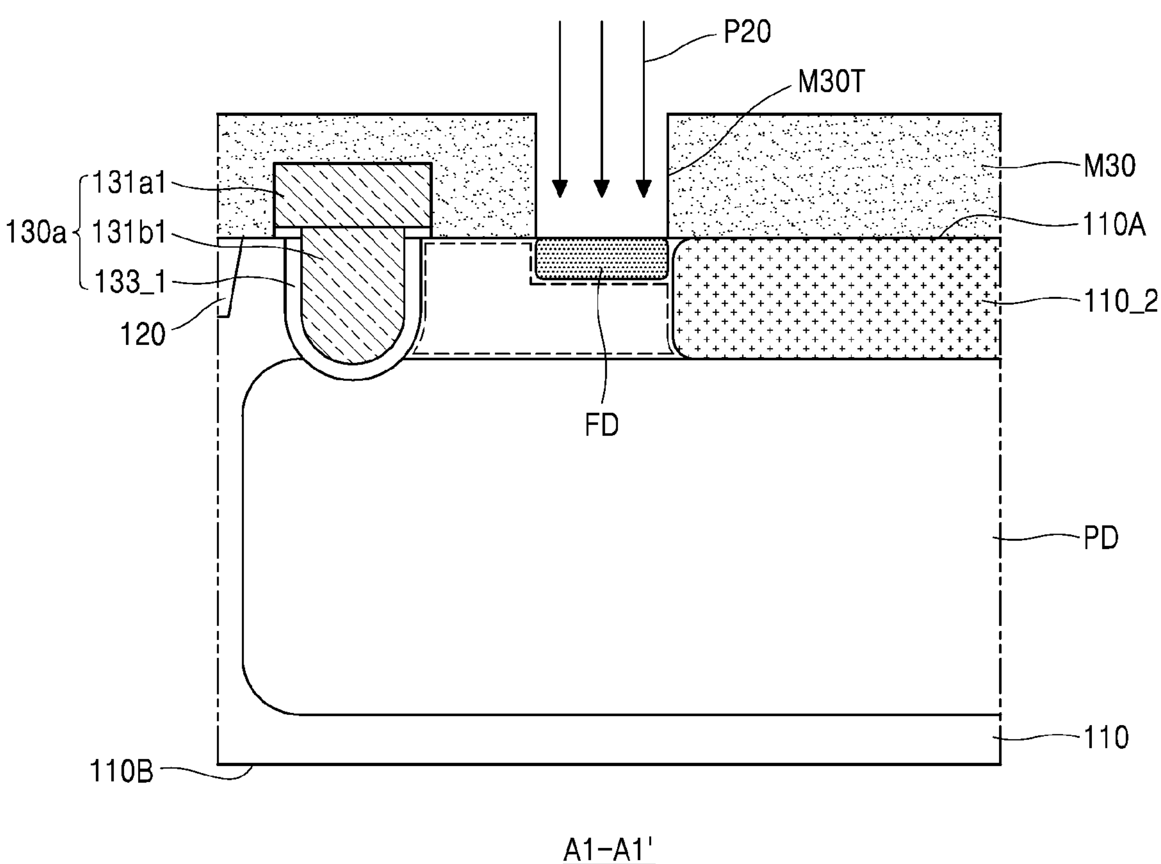

Referring to FIG. 14C, in the resultant structure of FIG. 14B, a second ion implantation mask M30 may be formed on the front surface 110A of the substrate 110. The second ion implantation mask M30 may include an opening M30T. The opening M30T is illustrated as not vertically overlapping the impurity semiconductor region 110_2 in FIG. 14C, but the opening M30T may partially or entirely overlap the impurity semiconductor region 110_2. Next, second impurities may be implanted into the substrate 110 by using the second ion implantation mask M30 due to an ion implantation process P20, and thus, a floating diffusion region FD may be formed. The second impurities may be, for example, n-type impurities.

Figure 14D:
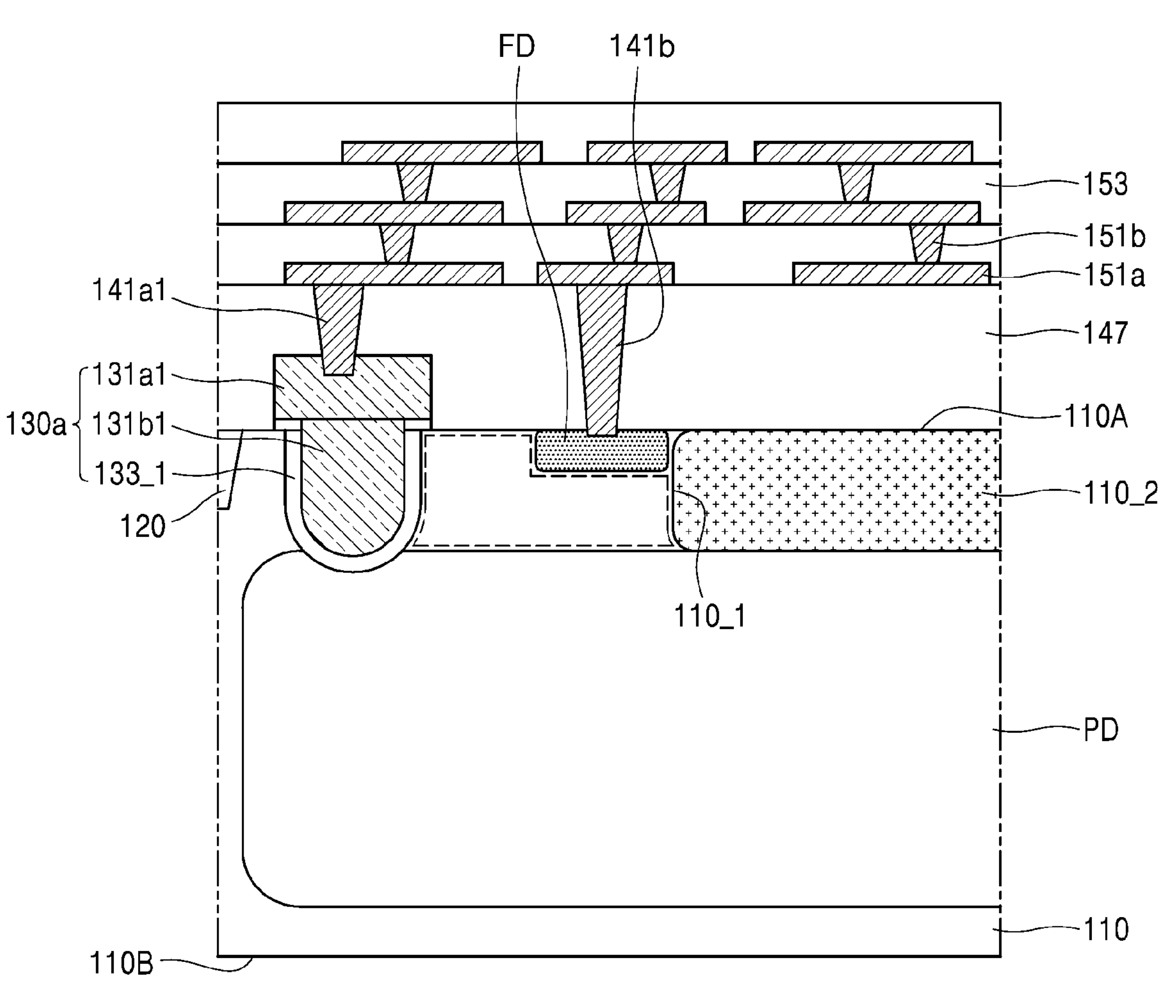

Referring to FIG. 14D, in the resultant structure of FIG. 14C, an interlayer insulating film 147 may be formed on the front surface 110A of the substrate 110. Next, a mask pattern (not shown) may be formed on the interlayer insulating film 147, and a first contact plug 141_a_1 and a second contact plug 141_b_ may be formed by using the mask pattern as an etch mask to pass through the interlayer insulating film 147. Thereafter, an operation of forming a conductive layer (not shown) on the interlayer insulating film 147, an operation of patterning the conductive layer, and an operation of forming an insulating layer (not shown) to cover the patterned conductive layer may be repeatedly performed, and thus, a wiring structure (refer to 150 in FIG. 4A) including a wiring line 151_a_, wiring via 151_b_, and a wiring insulating layer 153 may be formed.

Figure 14E:
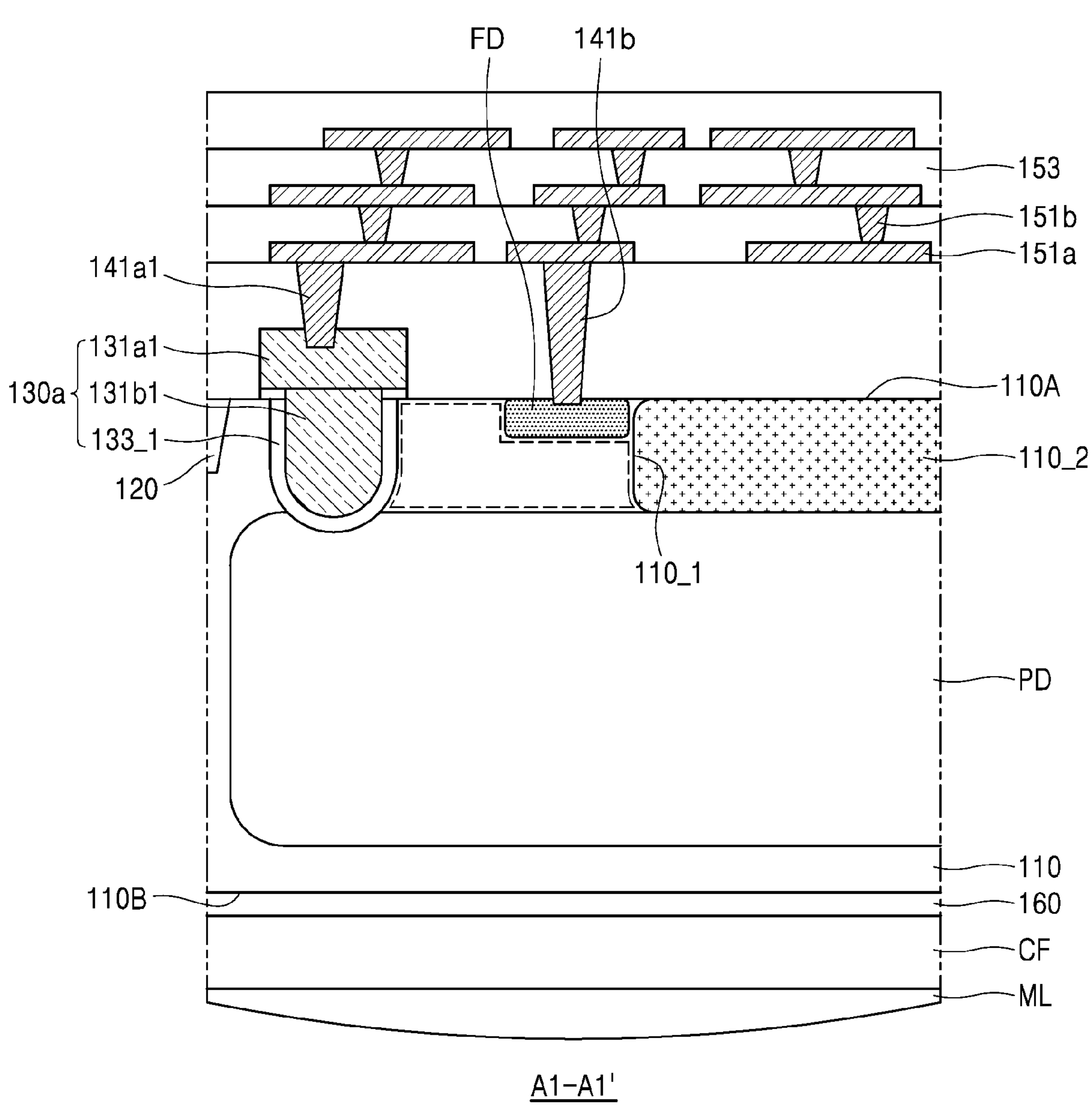

Referring to FIG. 14E, in the resultant structure of FIG. 14D, an anti-reflection film 160, the color filter CF, and a microlens ML may be sequentially formed on a rear surface 110B of the substrate 110, and thus, the image sensor 100 may be completed.

The image sensor 100 according to the embodiments may include an intrinsic semiconductor region 110_1, which is between the transfer gate 130_a_ and the floating diffusion region FD and is not additionally doped with impurities. Accordingly, when impurities are doped between the transfer gate 130_a_ and the floating diffusion region FD, RDF, which may occur due to the doped impurities, may be reduced. As a result, noise characteristics of the image sensor 100 may be improved, and the FWC of the image sensor 100 may be improved by preventing the occurrence of a potential hump.

Figure 15:
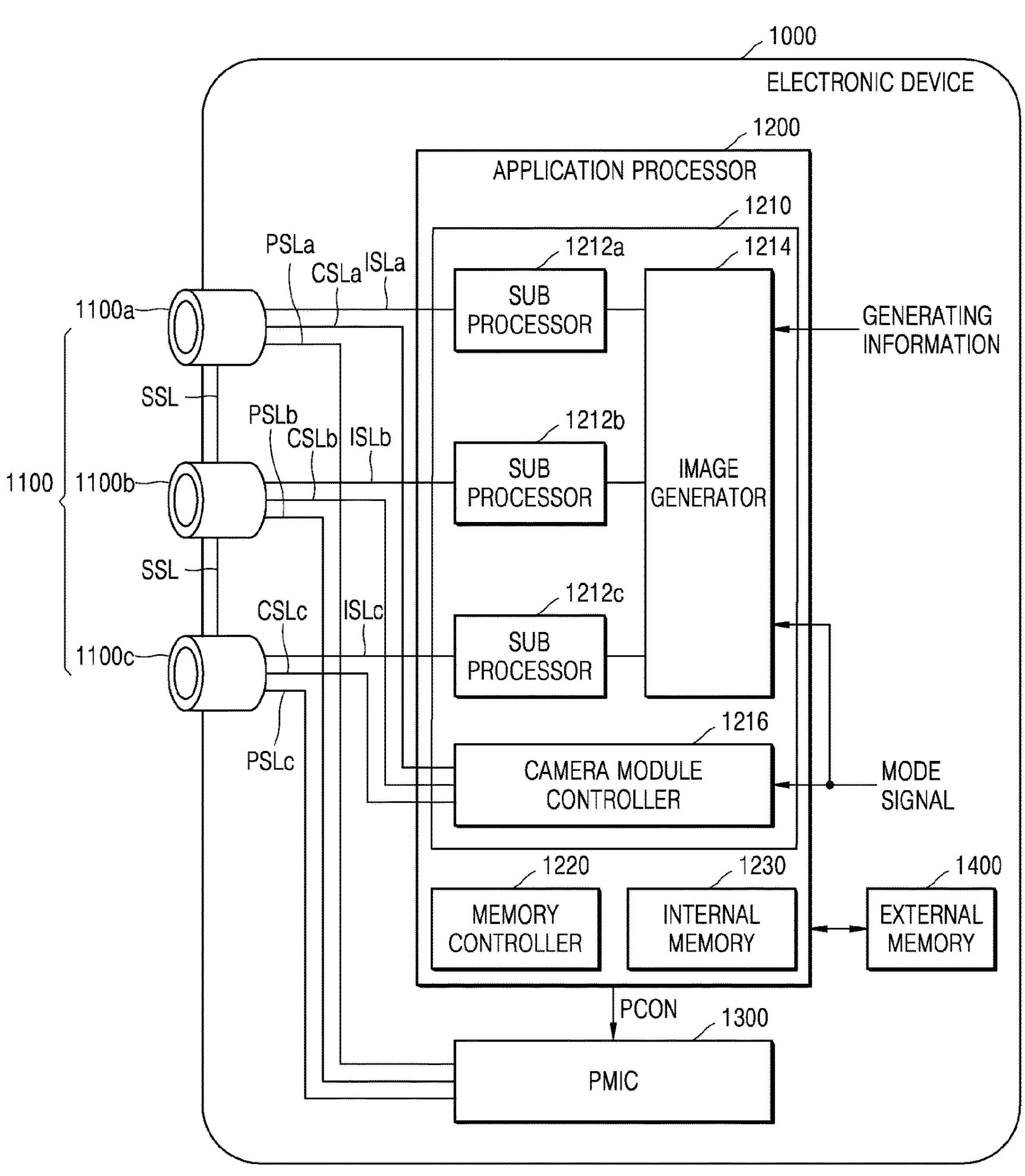
FIG. 15 is a block diagram of an electronic system according to an embodiment.
Figure 16:
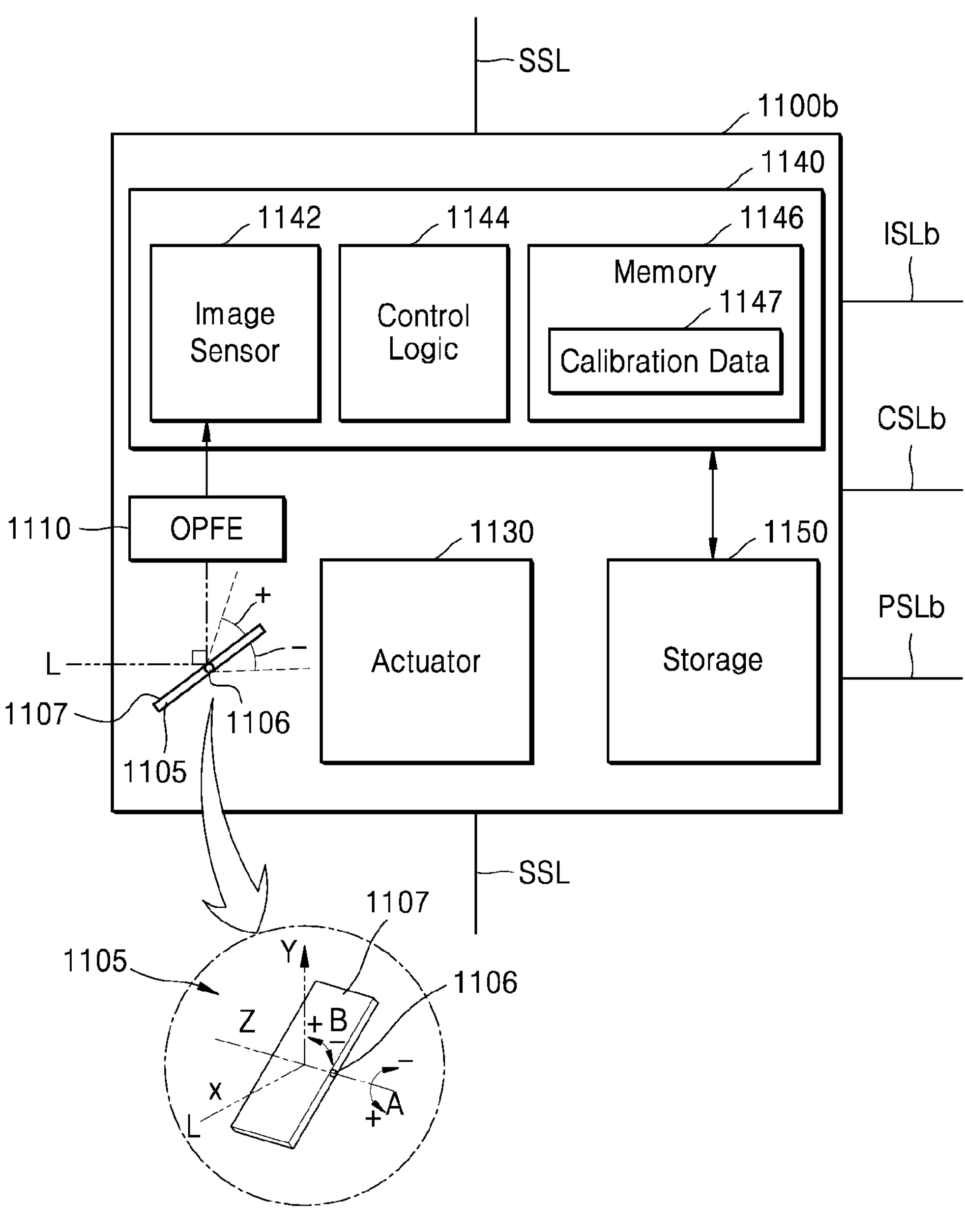
FIG. 16 is a detailed block diagram of a camera module included in the electronic system of FIG. 15.

FIG. 15 is a block diagram of an electronic device 1000 including a multi-camera module, according to an embodiment. FIG. 16 is a detailed block diagram of a camera module of FIG. 15.

Referring to FIG. 15, the electronic device 1000 may include a camera module group 1100, an application processor 1200, a power management integrated circuit (PMIC) 1300, and an external memory 1400.

The camera module group 1100 may include a plurality of camera modules (e.g., 1100*a*, 1100*b*, and 1100*c*). Although three camera modules 1100*a*, 1100*b*, and 1100*c* are illustrated in FIG. 15, embodiments are not limited thereto. In some embodiments, the camera module group 1100 may be modified to include only two camera modules. In some embodiments, the camera module group 1100 may be modified to include n camera modules, where n is a natural number of 4 or more.

The detailed configuration of the camera module 1100*b* will be described with reference to FIG. 16 below. The descriptions below may be also applied to the other camera modules 1100*a* and 1100*c*.

Referring to FIG. 16, the camera module 1100*b* may include a prism/mirror 1105, an optical path folding element (OPFE) 1110, an actuator 1130, an image sensing device 1140, and a storage 1150.

The prism/mirror 1105 may include a reflective surface 1107 of a light reflecting material and may change the path of light L incident from the outside.

In some embodiments, the prism/mirror 1105 may change the path of the light L incident in a first direction X into a second direction Y that is perpendicular to the first direction X. The prism/mirror 1105 may rotate the reflective surface 1107 of the light reflecting material in a direction A around a central shaft 1106 or rotate the central shaft 1106 in a direction B to change the path of the light L incident in the first direction X into the second direction Y perpendicular to the first direction X. In this case, the OPFE 1110 may move in a third direction Z, which is perpendicular to the first direction X and the second direction Y.

In some embodiments, as shown, an A-direction maximum rotation angle of the prism/mirror 1105 may be less than or equal to about 15 degrees in a plus (+) A direction and greater than about 15 degrees in a minus (−) A direction, but embodiments are not limited thereto.

In some embodiments, the prism/mirror 1105 may move by an angle of about 20 degrees or in a range from about 10 degrees to about 20 degrees or from about 15 degrees to about 20 degrees in a plus or minus B direction. In this case, an angle by which the prism/mirror 1105 moves in the plus B direction may be the same as or similar, within a difference of about 1 degree, to an angle by which the prism/mirror 1105 moves in the minus B direction.

In some embodiments, the prism/mirror 1105 may move the reflective surface 1107 of the light reflecting material in the third direction (e.g., the Z direction) parallel with an extension direction of the central shaft 1106.

The OPFE 1110 may include, for example, “m” optical lenses, where “m” is a natural number. The m lenses may move in the second direction Y and change an optical zoom ratio of the camera module 1100*b*. For example, when the default optical zoom ratio of the camera module 1100*b* is Z, the optical zoom ratio of the camera module 1100*b* may be changed to 3Z or 5Z or greater by moving the m optical lenses included in the OPFE 1110.

The actuator 1130 may move the OPFE 1110 or an optical lens to a certain position. For example, the actuator 1130 may adjust the position of the optical lens such that an image sensor 1142 is positioned at a focal length of the optical lens for accurate sensing.

The image sensing device 1140 may include the image sensor 1142, a control logic 1144, and a memory 1146. The image sensor 1142 may sense an image of an object using the light L provided through the optical lens. The control logic 1144 may control all operations of the camera module 1100*b*. For example, the control logic 1144 may control operation of the camera module 1100*b* according to a control signal provided through a control signal line CSLb.

The memory 1146 may store information, such as calibration data 1147, necessary for the operation of the camera module 1100*b*. The calibration data 1147 may include information, which is necessary for the camera module 1100*b* to generate image data using the light L provided from outside. The calibration data 1147 may include information about a degree of rotation, information about a focal length, information about an optical axis, or the like. When the camera module 1100*b* is implemented as a multi-state camera that has a focal length varying with the position of the optical lens, the calibration data 1147 may include a value of a focal length for each position (or state) of the optical lens and information about auto focusing.

The storage 1150 may store image data sensed by the image sensor 1142. The storage 1150 may be provided outside the image sensing device 1140 and may form a stack with a sensor chip of the image sensing device 1140. In some embodiments, although the storage 1150 may include electrically erasable programmable read-only memory (EEPROM), embodiments are not limited thereto.

Referring to FIGS. 15 and 16 together, in some embodiments, each of the camera modules 1100*a*, 1100*b*, and 1100*c* may include the actuator 1130. Accordingly, the camera modules 1100*a*, 1100*b*, and 1100*c* may include the calibration data 1147, which is the same or different among the camera modules 1100*a*, 1100*b*, and 1100*c* according to the operation of the actuator 1130 included in each of the camera modules 1100*a*, 1100*b*, and 1100*c*.

In some embodiments, one (e.g., the camera module 1100*b*) of the camera modules 1100*a*, 1100*b*, and 1100*c* may be of a folded-lens type including the prism/mirror 1105 and the OPFE 1110, which are described above, while the other camera modules (e.g., the camera modules 1100*a* and 1100*c*) may be of a vertical type that does not include the prism/mirror 1105 and the OPFE 1110. However, embodiments are not limited thereto.

In some embodiments, one (e.g., the camera module 1100*c*) of the camera modules 1100*a*, 1100*b*, and 1100*c* may include a vertical depth camera, which extracts depth information using an infrared ray (IR). In this case, the application processor 1200 may generate a three-dimensional (3D) depth image by merging image data provided from the depth camera with image data provided from another camera module (e.g., the camera module 1100*a* or 1100*b*).

In some embodiments, at least two camera modules (e.g., 1100*a* and 1100*b*) among the camera modules 1100*a*, 1100*b*, and 1100*c* may have different field-of-views. In this case, for example, the two camera modules (e.g., 1100*a* and 1100*b*) among the camera modules 1100*a*, 1100*b*, and 1100*c* may respectively have different optical lenses. However, embodiments are not limited thereto.

In some embodiments, the camera modules 1100*a*, 1100*b*, and 1100*c* may have different field-of-views from each other. In this case, although the camera modules 1100*a*,

1100*b*, and 1100*c* may respectively have different optical lenses, the inventive concept is not limited thereto.

In some embodiments, the camera modules 1100*a*, 1100*b*, and 1100*c* may be physically separated from one another. In other words, the sensing area of the image sensor 1142 is not divided and used by the camera modules 1100*a*, 1100*b*, and 1100*c*, but the image sensor 1142 may be independently included in each of the camera modules 1100*a*, 1100*b*, and 1100*c*.

Referring to FIG. 15 again, the application processor 1200 may include an image processing device 1210, a memory controller 1220, and an internal memory 1230. The application processor 1200 may be separately implemented from the camera modules 1100*a*, 1100*b*, and 1100*c*. For example, the application processor 1200 and the camera modules 1100*a*, 1100*b*, and 1100*c* may be implemented in different semiconductor chips and separated from each other.

The image processing unit 1210 may include a plurality of sub-processors (e.g., 1212*a*, 1212*b*, and 1212*c*), an image generator 1214, and a camera module controller 1216.

The image processing device 1210 may include sub-processors (e.g., 1212*a*, 1212*b*, and 1212*c*) in number corresponding to the number of camera modules (e.g., 1100*a*, 1100*b*, 1100*c*).

Pieces of image data respectively generated by the camera modules 1100*a*, 1100*b*, and 1100*c* may be respectively provided to the corresponding ones of the sub-processors 1212*a*, 1212*b*, and 1212*c* through image signal lines ISLa, ISLb, and ISLc separated from each other. For example, image data generated by the camera module 1100*a* may be provided to the sub-processor 1212*a* through the image signal line ISLa, image data generated by the camera module 1100*b* may be provided to the sub-processor 1212*b* through the image signal line ISLb, and image data generated by the camera module 1100*c* may be provided to the sub-processor 1212*c* through the image signal line ISLc. Such image data transmission may be performed using, for example, a mobile industry processor interface (MIPI)-based camera serial interface (CSI). However, aspects of the inventive concept are not limited thereto.

In some embodiments, a single sub-processor may be arranged to correspond to a plurality of camera modules. For example, differently from FIG. 15, the sub-processors 1212*a* and 1212*c* may not be separated but may be integrated into a single sub-processor, and the image data provided from the camera module 1100*a* or the camera module 1100*c* may be selected by a selection element (e.g., a multiplexer) and then provided to the integrated sub-processor.

The image data provided to each of the sub-processors 1212*a*, 1212*b*, and 1212*c* may be provided to the image generator 1214. The image generator 1214 may generate an output image by using the image data provided from each of the sub-processors 1212*a*, 1212*b*, and 1212*c* according to image generation information or a mode signal.

Specifically, the image generator 1214 may generate the output image by merging at least portions of respective pieces of image data, which are respectively generated by the camera modules 1100*a*, 1100*b*, and 1100*c* having different field-of-views, according to the image generation information or the mode signal. Alternatively, the image generator 1214 may generate the output image by selecting one of pieces of image data, which are respectively generated by the camera modules 1100*a*, 1100*b*, and 1100*c* having different field-of-views, according to the image generation information or the mode signal.

In some embodiments, the image generating information may include a zoom signal or a zoom factor. In some embodiments, the mode signal may be based on a mode selected by a user.

When the image generation information includes a zoom signal or a zoom factor and the camera modules 1100*a*, 1100*b*, and 1100*c* have different field-of-views, the image generator 1214 may perform different operations according to different kinds of zoom signals. For example, when the zoom signal is a first signal, the image generator 1214 may merge image data output from the camera module 1100*a* and image data output from the camera module 1100*c* and then generate an output image by using a merged image signal and image data output from the camera module 1100*b* and not used for merging. When the zoom signal is a second signal different from the first signal, the image generator 1214 may generate an output image by selecting one of the pieces of image data respectively output from the camera modules 1100*a*, 1100*b*, and 1100*c*, instead of performing the merging. However, embodiments are not limited thereto, and a method of processing image data may be changed whenever necessary.

In some embodiments, the image generator 1214 may receive a plurality of pieces of image data, which have different exposure times, from at least one of the sub-processors 1212*a*, 1212*b*, and 1212*c* and perform high dynamic range (HDR) processing on the pieces of image data, thereby generating merged image data having an increased dynamic range.

The camera module controller 1216 may provide a control signal to each of the camera modules 1100*a*, 1100*b*, and 1100*c*. A control signal generated by the camera module controller 1216 may be provided to a corresponding one of the camera modules 1100*a*, 1100*b*, and 1100*c* through a corresponding one of control signal lines CSLa, CSLb, and CSLc, which are separated from one another.

One (e.g., the camera module 1100*b*) of the camera modules 1100*a*, 1100*b*, and 1100*c* may be designated as a primary camera according to the mode signal or the image generation signal including a zoom signal, and the other camera modules (e.g., the camera modules 1100*a* and 1100*c*) may be designated as secondary cameras. Such designation information may be included in a control signal and provided to each of the camera modules 1100*a*, 1100*b*, and 1100*c* through a corresponding one of the control signal lines CSLa, CSLb, and CSLc, which are separated from one another.

A camera module operating as a primary or a secondary may be changed according to a zoom factor or an operation mode signal. For example, when the field-of-view of the camera module 1100*a* is greater than that of the camera module 1100*b* and the zoom factor indicates a low zoom ratio, the camera module 1100*b* may operate as a primary and the camera module 1100*a* may operate as a secondary. Contrarily, when the zoom factor indicates a high zoom ratio, the camera module 1100*a* may operate as a primary and the camera module 1100*b* may operate as a secondary.

In some embodiments, a control signal provided from the camera module controller 1216 to each of the camera modules 1100*a*, 1100*b*, and 1100*c* may include a sync enable signal. For example, when the camera module 1100*b* is a primary camera and the camera modules 1100*a* and 1100*c* are secondary cameras, the camera module controller 1216 may transmit the sync enable signal to the camera module 1100*b*. The camera module 1100*b* provided with the sync enable signal may generate a sync signal based on the sync enable signal and may provide the sync signal to the camera modules 1100_a_ and 1100_c_ through a sync signal line SSL. The camera modules 1100_a_, 1100_b_, and 1100_c_ may be synchronized with the sync signal and may transmit image data to the application processor 1200.

In some embodiments, a control signal provided from the camera module controller 1216 to each of the camera modules 1100_a_, 1100_b_, and 1100_c_ may include mode information according to the mode signal. The camera modules 1100_a_, 1100_b_, and 1100_c_ may operate in a first operation mode or a second operation mode in relation with a sensing speed based on the mode information.

In the first operation mode, the camera modules 1100_a_, 1100_b_, and 1100_c_ may generate an image signal at a first speed (e.g., at a first frame rate), encode the image signal at a second speed higher than the first speed (e.g., at a second frame rate higher than the first frame rate), and transmit an encoded image signal to the application processor 1200. In this case, the second speed may be 30 times or less the first speed.

The application processor 1200 may store the received image signal (i.e., the encoded image signal) in the internal memory 1230 therein or the external memory 1400 outside the application processor 1200. Thereafter, the application processor 1200 may read the encoded image signal from the internal memory 1230 or the external memory 1400, decode the encoded image signal, and display image data generated based on a decoded image signal. For example, a corresponding one of the sub-processors 1212_a_, 1212_b_, and 1212_c_ of the image processing unit 1210 may perform the decoding and may also perform image processing on the decoded image signal.

In the second operation mode, the camera modules 1100_a_, 1100_b_, and 1100_c_ may generate an image signal at a third speed lower than the first speed (e.g., at a third frame rate lower than the first frame rate) and transmit the image signal to the application processor 1200. The image signal provided to the application processor 1200 may not have been encoded. The application processor 1200 may perform image processing on the image signal or store the image signal in the internal memory 1230 or the external memory 1400.

The PMIC 1300 may provide power (e.g., a power supply voltage) to each of the camera modules 1100_a_, 1100_b_, and 1100_c_. For example, under control by the application processor 1200, the PMIC 1300 may provide first power to the camera module 1100_a_ through a power signal line PSLa, second power to the camera module 1100_b_ through a power signal line PSLb, and third power to the camera module 1100_c_ through a power signal line PSLc.

The PMIC 1300 may generate power corresponding to each of the camera modules 1100_a_, 1100_b_, and 1100_c_ and adjust the level of the power, in response to a power control signal PCON from the application processor 1200. The power control signal PCON may include a power adjustment signal for each operation mode of the camera modules 1100_a_, 1100_b_, and 1100_c_. For example, the operation mode may include a low-power mode. In this case, the power control signal PCON may include information about a camera module configured to operate in the low-power mode and a power level to be set. The same or different levels of power may be respectively provided to the camera modules 1100_a_, 1100_b_, and 1100_c_. The level of power may be dynamically changed.

While aspects of the inventive concept have been particularly shown and described with reference to embodiments thereof, it will be understood that various changes in form and details may be made therein without departing from the spirit and scope of the following claims.

What is claimed is:

1. An image sensor comprising:
a substrate;
at least one transfer gate on a top surface of the substrate;
a floating diffusion region located in the substrate and disposed apart from the at least one transfer gate in a first direction, the first direction being parallel to the top surface of the substrate;
an intrinsic semiconductor region located in the substrate and disposed between the at least one transfer gate and the floating diffusion region in the first direction; and
a photoelectric conversion region located in the substrate and disposed apart from the floating diffusion region in a second direction, the second direction being perpendicular to the first direction,
wherein the intrinsic semiconductor region is an undoped region.

2. The image sensor of claim 1, wherein the intrinsic semiconductor region extends in the second direction to a top surface of the photoelectric conversion region.

3. The image sensor of claim 1, wherein a partial region of the intrinsic semiconductor region, which is at a lower level in the second direction than the floating diffusion region, extends in the first direction and overlaps the entirety of the floating diffusion region in the second direction.

4. The image sensor of claim 1, wherein a partial region of the intrinsic semiconductor region, which is at a lower level in the second direction than the floating diffusion region, extends in the first direction and overlaps a portion of the floating diffusion region in the second direction.

5. The image sensor of claim 1, wherein the intrinsic semiconductor region does not overlap the floating diffusion region in the second direction.

6. The image sensor of claim 1, wherein the at least one transfer gate comprises a lateral portion on the top surface of the substrate, a vertical portion extending into the substrate from a bottom surface of the lateral portion, and a gate insulating layer covering the lateral portion and the vertical portion.

7. The image sensor of claim 6, wherein the intrinsic semiconductor region is in contact with the gate insulating layer.

8. The image sensor of claim 1, further comprising an impurity semiconductor region in contact with the intrinsic semiconductor region and the floating diffusion region.

9. The image sensor of claim 1, further comprising a plurality of transfer gates on the top surface of the substrate,
wherein each of the plurality of transfer gates comprises a lateral portion on the top surface of the substrate, a vertical portion extending into the substrate from a bottom surface of the lateral portion, and a gate insulating layer covering the lateral portion and the vertical portion.

10. The image sensor of claim 9, wherein the intrinsic semiconductor region is disposed between the floating diffusion region and each of the plurality of transfer gates in the first direction.

11. The image sensor of claim 9, wherein the intrinsic semiconductor region is in contact with the gate insulating layer.

12. The image sensor of claim 1, wherein the transfer gate is a planar transfer gate.

13. An image sensor comprising:
a substrate;
a floating diffusion region in the substrate;

a plurality of photoelectric conversion regions located in the substrate and disposed around the floating diffusion region;

a plurality of transfer gates, wherein at least one transfer gate is in each of the plurality of photoelectric conversion regions and disposed apart from the floating diffusion region in a first direction, the first direction being parallel to a top surface of the substrate; and an intrinsic semiconductor region located in the substrate and disposed between each of the transfer gates and the floating diffusion region in the first direction, wherein the intrinsic semiconductor region is an undoped region.

14. The image sensor of claim 13, wherein the intrinsic semiconductor region extends, in a second direction perpendicular to the first direction, to a top surface of each of the photoelectric conversion regions.

15. The image sensor of claim 13, wherein each of the transfer gates comprises a lateral portion on the top surface of the substrate, a vertical portion extending into the substrate from a bottom surface of the lateral portion, and a gate insulating layer covering the lateral portion and the vertical portion.

16. The image sensor of claim 13, wherein a partial region of the intrinsic semiconductor region, which is at a lower level in a second direction than the floating diffusion region, extends in the first direction and overlaps the entirety of the floating diffusion region in the second direction, wherein the second direction is perpendicular to the first direction.

17. The image sensor of claim 13, wherein a partial region of the intrinsic semiconductor region, which is at a lower level in a second direction than the floating diffusion region, extends in the first direction and overlaps a portion of the floating diffusion region in a second direction, wherein the second direction is perpendicular to the first direction.

18. The image sensor of claim 13, wherein at least two transfer gates are in each of the plurality of photoelectric conversion regions, and each of the at least two transfer gates comprises a lateral portion on the top surface of the substrate, a vertical portion extending into the substrate from a bottom surface of the lateral portion, and a gate insulating layer covering the lateral portion and the vertical portion.

19. An image sensor comprising:

a substrate;

two transfer gates on a top surface of the substrate;

a floating diffusion region located in the substrate and disposed apart from the transfer gates in a first direction, the first direction being parallel to the top surface of the substrate;

an intrinsic semiconductor region located in the substrate and disposed between each of the transfer gates and the floating diffusion region in the first direction;

an impurity semiconductor region in contact with the floating diffusion region and the intrinsic semiconductor region, the impurity semiconductor region being doped with conductive impurities; and a photoelectric conversion region located in the substrate and disposed apart from the floating diffusion region in a second direction, wherein the second direction is perpendicular to the first direction, wherein the intrinsic semiconductor region is an undoped region and extends in the second direction to a top surface of the photoelectric conversion region.

20. The image sensor of claim 19, wherein each of the transfer gates comprises a lateral portion on the top surface of the substrate, a vertical portion extending into the substrate from a bottom surface of the lateral portion, and a gate insulating layer covering the lateral portion and the vertical portion, and the intrinsic semiconductor region is in contact with the gate insulating layer.

* * * * *